United States Patent [19]

Finger

[11] Patent Number: 5,451,881

[45] Date of Patent: Sep. 19, 1995

[54] METHOD AND MEANS FOR ADJUSTING BATTERY MONITOR BASED ON RATE OF CURRENT DRAWN FROM THE BATTERY

[75] Inventor: Eugene P. Finger, Brewster, N.Y.

[73] Assignee: Curtis Instruments, Inc., Mt. Kisco, N.Y.

[21] Appl. No.: 224,072

[22] Filed: Apr. 7, 1994

Related U.S. Application Data

[63] Continuation-in-part of Ser. No. 166,085, Dec. 10, 1993, abandoned.

[51] Int. Cl.$^6$ ............................................. G01N 27/416
[52] U.S. Cl. .................................... 324/433; 324/427; 320/48
[58] Field of Search ............... 324/426, 427, 428, 433; 320/48; 340/636

[56] References Cited

U.S. PATENT DOCUMENTS

| | | | |
|---|---|---|---|
| 4,017,724 | 4/1977 | Finger | 340/636 X |
| 4,390,841 | 6/1983 | Martin et al. | 324/427 |
| 4,453,129 | 6/1984 | Lissalde et al. | 324/426 X |
| 4,560,937 | 12/1985 | Finger | 324/433 |

Primary Examiner—Kenneth A. Wieder
Assistant Examiner—Glenn W. Brown
Attorney, Agent, or Firm—John H. Crozier

[57] ABSTRACT

In a preferred embodiment, a metering system for measuring and indicating the state of charge of an electrical storage battery, including: apparatus for storing a numerical value indicative of the state of charge of the battery and for providing an output voltage signal representative thereof; apparatus for detecting the terminal voltage of the battery, coupled to the apparatus for storing, and being operable to generate a function of the battery terminal voltage which is a substantially proportional fraction of the terminal voltage and to provide an input to the apparatus for storing if the function is below a threshold variable reference voltage signal; apparatus for receiving the output voltage signal and for generating the variable reference voltage signal therefrom, the variable reference voltage signal being lowered as a function of the output voltage signal as the output voltage signal indicates progressively lower states of charge; and apparatus for measuring the level of current drawn from the battery and adjusting the apparatus for receiving and generating, in proportion to the current level, such that the variable reference voltage signal will be greater or lesser depending on the current level.

16 Claims, 26 Drawing Sheets

A BLOCK DIAGRAM FOR THE AA933

A VOLTAGE SIGNAL CONDITIONER
TARNSFORM FOR THE AA933

SINGLE A-D CONVERTER MODIFICATION OF FIG.18

OCP RELATIONSHIP FOR BATTERY IN FIG. 21

| NOMINAL THRESHOLD CURRENT (AMPERES) | SHUNT VOLTAGE | | | A-D CONVERTER INPUT VOLTAGE | | | TOTAL ± % |
|---|---|---|---|---|---|---|---|
| | NOMINAL (MILLIVOLTS) | ERROR LIMITS (MILLIVOLTS) | | NOMINAL (MILLIVOLTS) | ERROR LIMITS (MILLIVOLTS) | | |
| | | MINIMUM | MAXIMUM | | MINIMUM | MAXIMUM | |
| 80 | 16.53 | 13.88 | 19.18 | 800 | 671.6 | 928.4 | 16 |
| 170 | 35.12 | 30.61 | 39.63 | 1700 | 1481.6 | 1919.4 | 13 |
| 270 | 55.78 | 49.20 | 62.36 | 2700 | 2381.6 | 3018.4 | 12 |
| 380 | 78.51 | 69.66 | 87.36 | 3800 | 3371.6 | 4228.4 | 11 |
| 500 | 103.30 | 91.97 | 114.63 | 5000 | 4451.6 | 5548.4 | 11 |

THE CALCULATED ERROR LIMITS ASSUME A ±1 MILLIVOLT SYSTEM OFFSET ERROR, REFERRED BACK TO THE SHUNT, COMBINED WITH A ±10% SHUNT RESISTANCE ERROR.

THE FIVE CURRENT THRESHOLDS

FIG. 23

| INTEGRATION ZONE | NOMINAL CURRENT RANGE (AMPERES) | INTERGRATION THRESHOLDS EXPRESSED IN VOLTS PER CELL AT COMPUTED STATES-OF-CHARGE EQUAL TO: | | INTEGRATION RATES EXPRESSED IN OPEN LOOP HOURS FULL SCALE | |
|---|---|---|---|---|---|
| | | 100% | 0%(NOTE) | NORMAL | FAULT DETECTED |
| A | BELOW 80 | 2.04 | 1.85 | 4 | 2/3 |
| B | 80 TO 170 | 2.02 | 1.82 | 4 | 2/3 |
| C | 170 TO 270 | 1.98 | 1.77 | 2 | 1/2 |
| D | 270 TO 380 | 1.94 | 1.72 | 1 | 1/2 |
| E | 380 TO 500 | 1.90 | 1.67 | 1/2 | 1/3 |
| F | ABOVE 500 | 1.86 | 1.62 | 1/3 | 1/3 |

NOTE: 0% COMPUTED STATE-OF-CHARGE IS ACTUALLY 80% DEPTH-OF-DISCHARGE

INTEGRATION THRESHOLDS AND RATES ASSIGNED TO THE SIX CURRENT ZONES

FIG. 24A

| INTEGRATION RATES EXPRESSED AS AN INTEGER SUBTRACTION ||
|---|---|
| NORMAL | FAULT DETECTED |
| 1 | 6 |
| 1 | 6 |
| 2 | 8 |
| 4 | 8 |
| 8 | 12 |
| 12 | 12 |

| IF THE CURRENT IS | AND THE VOLTAGE IS | THE INTERGER DECREMENT MUST BE | AND THE RESULTANT DECIMAL NUMBER WILL BE |
|---|---|---|---|
| 0 TO 4 | ANY | 0 | 360,000 |
| 4 TO 80 | ABOVE 46.68<br>BETWEEN 45.00 & 46.68<br>BELOW 45.00 | 0<br>1<br>6 | 360,000<br>359,999<br>359,994 |
| 80 TO 170 | ABOVE 46.08<br>BETWEEN 43.92 & 46.08<br>BELOW 43.92 | 0<br>1<br>6 | 360,000<br>359,999<br>359,994 |
| 170 TO 270 | ABOVE 45.00<br>BETWEEN 42.84 & 45.00<br>BELOW 42.84 | 0<br>2<br>8 | 360,000<br>359,998<br>359,992 |
| 270 TO 380 | ABOVE 43.92<br>BETWEEN 41.76 & 43.92<br>BELOW 41.76 | 0<br>4<br>8 | 360,000<br>359,996<br>359,992 |
| 380 TO 500 | ABOVE 42.84<br>BETWEEN 41.76 & 42.84<br>BELOW 41.76 | 0<br>8<br>12 | 360,000<br>359,992<br>359,988 |
| ABOVE 500 | ABOVE 40.68<br>BELOW 40.68 | 0<br>12 | 360,000<br>359,988 |

NOTES: CURRENT IS EXPRESSED IN AMPERES. VOLTAGE IS EXPRESSED IN VOLTS DC. 50% COMPUTED STATE-OF-CHARGE= DECIMAL NUMBER 360,000.

EIGHTEEN POSSIBILITIES RESULTING FROM A SINGLE DATA CONVERSION ILLUSTRATED FOR 50% COMPUTED STATE-OF-CHARGE

FIG. 26

A WAKE-UP PROGRAM FOR QUIESCENT MONITORING

METHOD AND MEANS FOR ADJUSTING BATTERY MONITOR BASED ON RATE OF CURRENT DRAWN FROM THE BATTERY

This is a continuation-in-part of application Ser. No. 08/166,085 filed on Dec. 10, 1993, now abandoned.

BACKGROUND OF THE INVENTION

1. Field of the Invention

The present invention relates to apparatus for monitoring the operation of a battery generally and, more particularly, but not by way of limitation, to novel method and means for adjusting a battery monitor based on the rate of current drawn from the battery.

2. Background Art

In U.S. Pat. No. 4,560,937, issued Dec. 24, 1985, to Eugene P. Finger, and titled BATTERY STATE OF CHARGE METERING METHOD AND APPARATUS, incorporated by reference hereinto, there is disclosed a metering system for measuring and indicating the state of charge of an electric storage battery which includes a digital integrator having a plurality of digital states operable to store a numerical value in binary digital form which is indicative of the state of charge, the integrator being operable to change the numerical value stored therein in one direction in response to detected decreases in state of charge as the battery is being discharged. The integrator generates a series of voltage pulses on a single output line, each pulse corresponding in length to the binary digital value stored in a predetermined number of the highest order binary stages of the digital integrator to provide a time-based resultant indication of the binary digital value. A filter circuit is provided for filtering the pulses to provide a substantially smooth analog output voltage signal having a voltage amplitude corresponding to the summation of the pulses.

The system of the above-referenced patent, including, in detail, aspects thereof particularly relevant to the present disclosure, is shown schematically on FIG. 1. For convenient reference to the same-numbered figure of that patent, the same reference numerals have been used, except that, in the present FIG. 1, those reference numerals are preceded by the numeral "6". The present invention is applicable to other battery monitoring systems, as will be described later, but the operation of the system of the above-referenced patent will be set forth in some detail for background on the operation of such systems generally.

The metering system is connected to an electric storage battery 610 and to a load 616. A fixed fraction of the battery voltage is supplied from a voltage divider consisting of resistors 626 and 628 through a connection 632 to a threshold comparator 634. The fixed fraction of the battery voltage is compared by comparator 634 with a reference voltage supplied through a connection 636 from a reference voltage slope network 638 which is described more fully below. Whenever load is applied to battery 610, the resultant downward excursion in the battery terminal voltage is detected by comparator 634. If the downward excursion is below a threshold, as determined by the reference voltage on connection 636, a resultant signal is provided to a digital circuit unit 642 at "IN" through a resistor 640. Digital circuit unit 642 generates a continuous series of voltage pulses at output terminal "FB" to output connection 646, the voltage pulses respectively corresponding in length to the binary digital value stored in the digital circuit unit. The pulses are then filtered in a low pass filter combination consisting of a resistor 648 and a capacitor 650 to provide a substantially smooth analog output voltage signal having a voltage amplitude corresponding to the binary digital value stored in digital circuit unit 642. That voltage is amplified by an operational amplifier 652 connected as a voltage follower amplifier. The resultant amplified output voltage optionally may be supplied through a connection 654 to a voltmeter 656 to thereby visually indicate the state of charge of battery 610.

A resistor 6131 and a capacitor 6132 connected to a clock oscillator (not shown) within digital circuit unit 642 determine the frequency of operation of the unit and, therefore, the integration rate thereof.

The output from amplifier 652 is also supplied to reference voltage slope network 638 so that the network may generate a variable reference signal which is a function of the analog output voltage signal. The reference voltage is also determined in part by a substantially constant reference voltage signal on input connection 658, the constant reference voltage signal being derived from other portions of the system (not shown).

It is apparent from an inspection of network 638 that, in the absence of an input to the network from amplifier 652, the reference voltage output on connection 636 which sets the voltage threshold for comparator 634 would be a constant fraction of the substantially constant reference voltage on input connection 658, as determined by voltage divider resistors 682 and 684. However, the input from amplifier 652 is operable to reduce the threshold voltage level at connection 636 as the discharge of battery 610 progresses, as recorded by the integrator (not shown) contained within digital circuit unit 642. This is appropriate, since the terminal voltage of battery 610 will decrease for each load current level as the discharge of the battery progresses. Thus, the downward adjustment of the reference voltage threshold as a function of the battery discharge condition prevents faster integration than is warranted. The variable reference voltage may approximate a nominal loaded open circuit battery terminal voltage at the various states of discharge of the battery. The voltage supplied through amplifier 652 to network 638 may be characterized as a feedback voltage.

The voltage output from amplifier 652 supplied to network 638 is at its highest when battery 610 is fully charged and when the system is registering a fully charged condition. However, the voltage relationships are such that the voltage at the circuit node between resistors 674 and 676 is always somewhat below the voltage at the node between the vertical leg resistors 682 and 684 so that the cross connection formed by resistors 678 and 680 causes a downward translation of the voltage at the node between resistors 682 and 684 which is the output voltage reference on connection 636. Adjustment of variable resistor 678 changes this downward offset, with reducing the value of the variable resistor increasing the offset, and increasing the value of the variable resistor reducing the offset. As the system indicates a depletion of the charge, on the basis of the number stored in the integrator (not shown) contained within digital circuit unit 642, the voltage output level of amplifier 652 is reduced and the reference voltage is correspondingly reduced, producing a sloping characteristic, or transform. This threshold reference voltage characteristic is illustrated on FIG. 2 as curve 686.

Curve 686 on FIG. 2 represents a plot of the threshold voltage output from network 638 on connection 636 versus the state of charge, as indicated by the numerical value stored in digital circuit unit 642. It will be seen that the voltage value slopes downwardly as the percent of charge remaining decreases, since the battery terminal voltage generally decreases as the charge is depleted and, therefore, the resulting lower voltage excursions on load look like heavier loads to the metering system.

Curves 690 and 692 on FIG. 2 illustrate the performance of network 638 with greater vertical displacements caused by successive reductions in the variable resistor 678. It is a very useful feature of network 638 that adjustments in the vertical displacement of the threshold voltage characteristic also provide an appropriate change in the slope of the characteristic. The main reason for providing the adjustments available from variable resistor 678 is to accommodate for different objectives of different users in terms of battery life versus maximum battery energy output per charge. For example, for a user who places the major emphasis on battery life, the battery must be considered as fully discharged at a higher specific gravity per cell, and at a higher final battery terminal voltage than would otherwise be attained. For that user, network 638 might be adjusted to provide for the voltage threshold curve 686. For another example, for a user who wishes to obtain more energy from the battery by discharging the battery more deeply, even though battery life may be compromised, one or the other of curves 690 and 692 might be selected by suitable adjustment of variable resistor 678.

It has been found that a "factory set" variable resistor 678 is quite satisfactory in most applications, where the factory setting takes into account anticipated usage of the battery. In other cases, however, setting of variable resistor 678 must be done in the field to account for unknown variables. The setting of variable resistor 678 is a compromise in a single, simple adjustment to accommodate such variables as battery type, battery size, desired depth-of-discharge, and average loading.

It has been found, further, that the system of FIG. 1, whether variable resistor 678 is factory or field set, is quite satisfactory in applications in which batteries are used in a day's work with a "normal" statistical mix of loads and with a properly sized battery. However, providing variable resistor 678 with a "fixed" setting may not be satisfactory when the types of use a battery encounters vary considerable from day to day. An example of such variable use is in a paper mill where, on one day, a battery-operated forklift truck might be used to relocate pallet loads of facial tissue, resulting in only light battery use and, on another day, the same forklift truck might be used to carry logs, requiring heavy battery use. In such cases of wide variability of use, it would be desirable to be able to automatically alter threshold voltage depending on the type of use of the battery. Extreme variations in use can also be compensated for by altering the integration rate, either with or without a change in threshold voltage.

Accordingly, it is a principal object of the present invention to provide method and means for automatically adjusting a battery operation monitor to compensate for variations in use of the battery.

It is a further object of the invention to make such adjustments by reference to the rate of discharge of the battery.

It is another object of the invention to provide such means that can be economically constructed.

Other objects of the present invention, as well as particular features, elements, and advantages thereof, will be elucidated in, or be apparent from, the following description and the accompanying drawing figures.

SUMMARY OF THE INVENTION

The present invention achieves the above objects, among others, by providing, in a preferred embodiment, a metering system for measuring and indicating the state of charge of an electrical storage battery, comprising: means for storing a numerical value indicative of the state of charge of said battery and for providing an output voltage signal representative thereof; means for detecting the terminal voltage of said battery, coupled to said means for storing, and being operable to generate a function of said battery terminal voltage which is a substantially proportional fraction of said terminal voltage and to provide an input to said means for storing if said function is below a threshold variable reference voltage signal; means for receiving said output voltage signal and for generating said variable reference voltage signal therefrom, said variable reference voltage signal being lowered as a function of said output voltage signal as said output voltage signal indicates progressively lower states of charge; and means for measuring the level of current drawn from said battery and adjusting said means for receiving and generating, in proportion to said current level, such that said variable reference voltage signal will be greater or lesser depending on said current level.

BRIEF DESCRIPTION OF THE DRAWING

Understanding of the present invention and the various aspects thereof will be facilitated by reference to the accompanying drawing figures, submitted for purposes of illustration only and not intended to define the scope of the invention, on which:

FIG. 23 is a representation of error limits with the use of five threshold current levels.

FIG. 24 is a representation of integration thresholds and rates assigned to the six current zones defined by the threshold current levels of FIG. 23.

FIG. 26 is a representation of conversion intervals derived from the parameters of FIGS. 23–25.

DETAILED DESCRIPTION OF THE PREFERRED EMBODIMENTS

Figure 1:
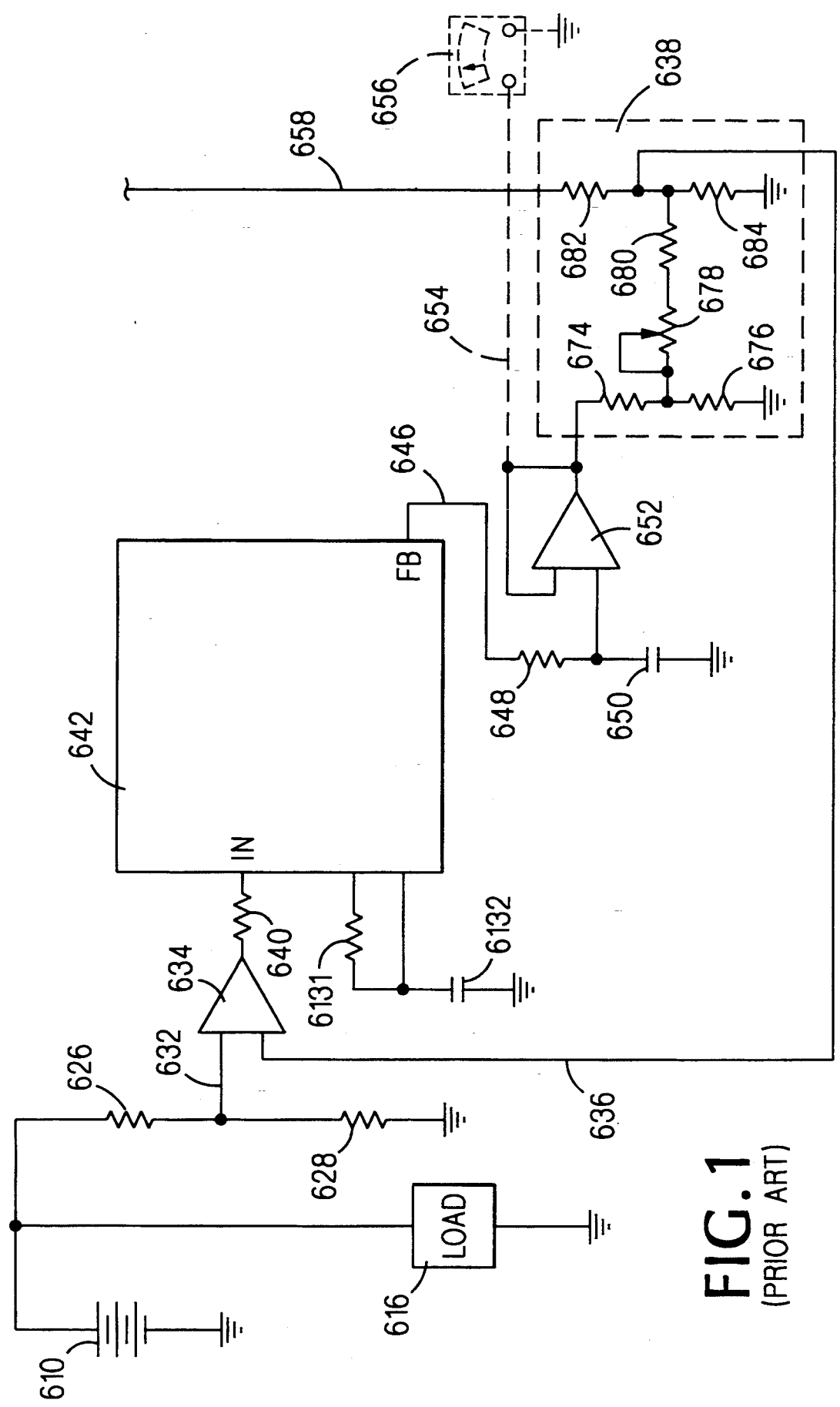
FIG. 1 is schematic/block diagram illustrating one battery monitoring system to which the present invention may be applied.

Reference should now be made to the drawing figures, on which similar or identical elements are given consistent identifying numerals throughout the various figures thereof, and on which parenthetical references to figure numbers direct the reader to the view(s) on which the element(s) being described is (are) best seen, although the element(s) may be seen also on other views.

Figure 2:
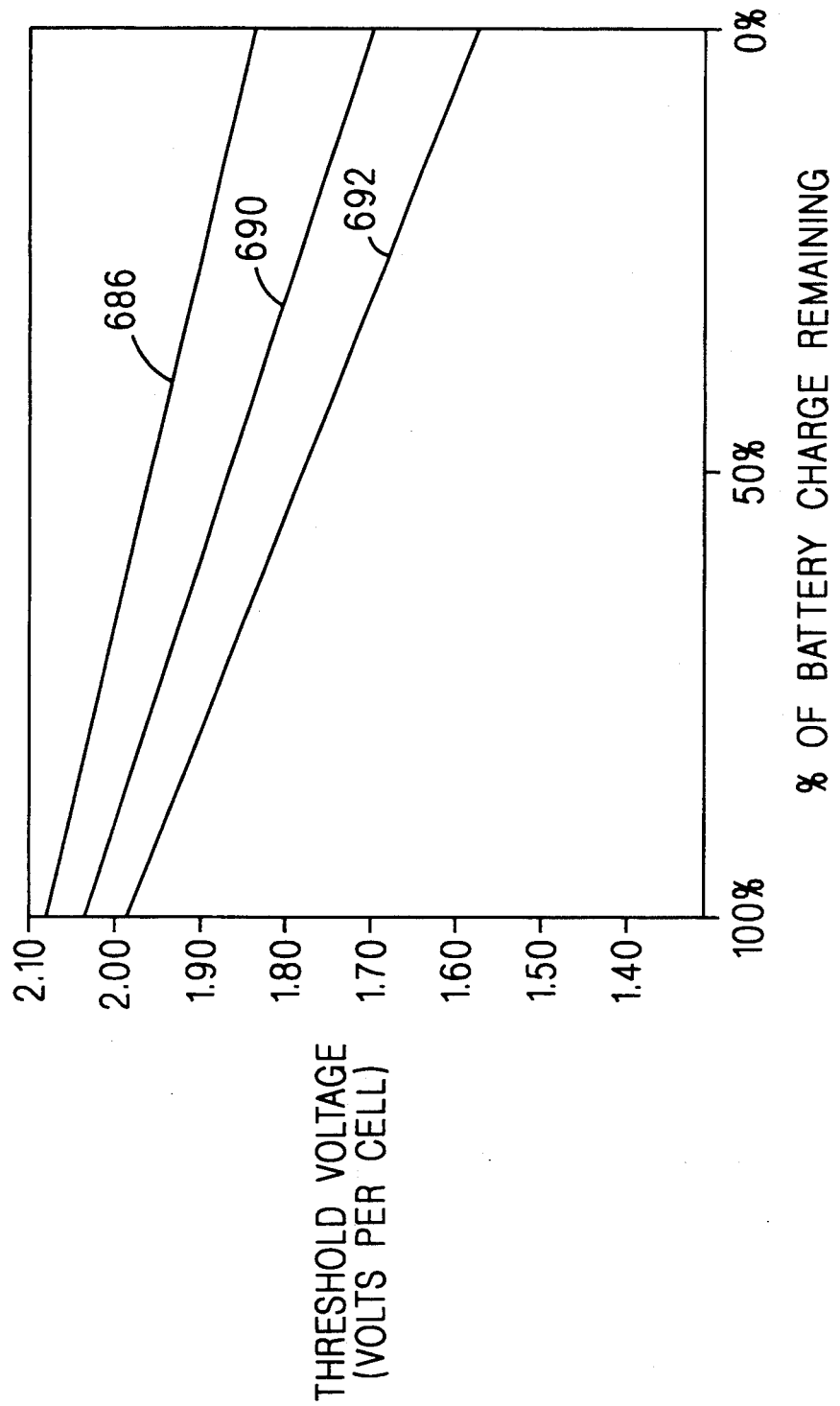
FIG. 2 is a graphic representation of the threshold voltage locus at which battery discharge conditions are detected by the system of FIG. 1 during the course of a full battery discharge cycle, with different locus curves representing different feedback reference adjustments.

FIGS. 1 and 2 have been described above and, therefore, the description thereof is not repeated here.

Figure 3:
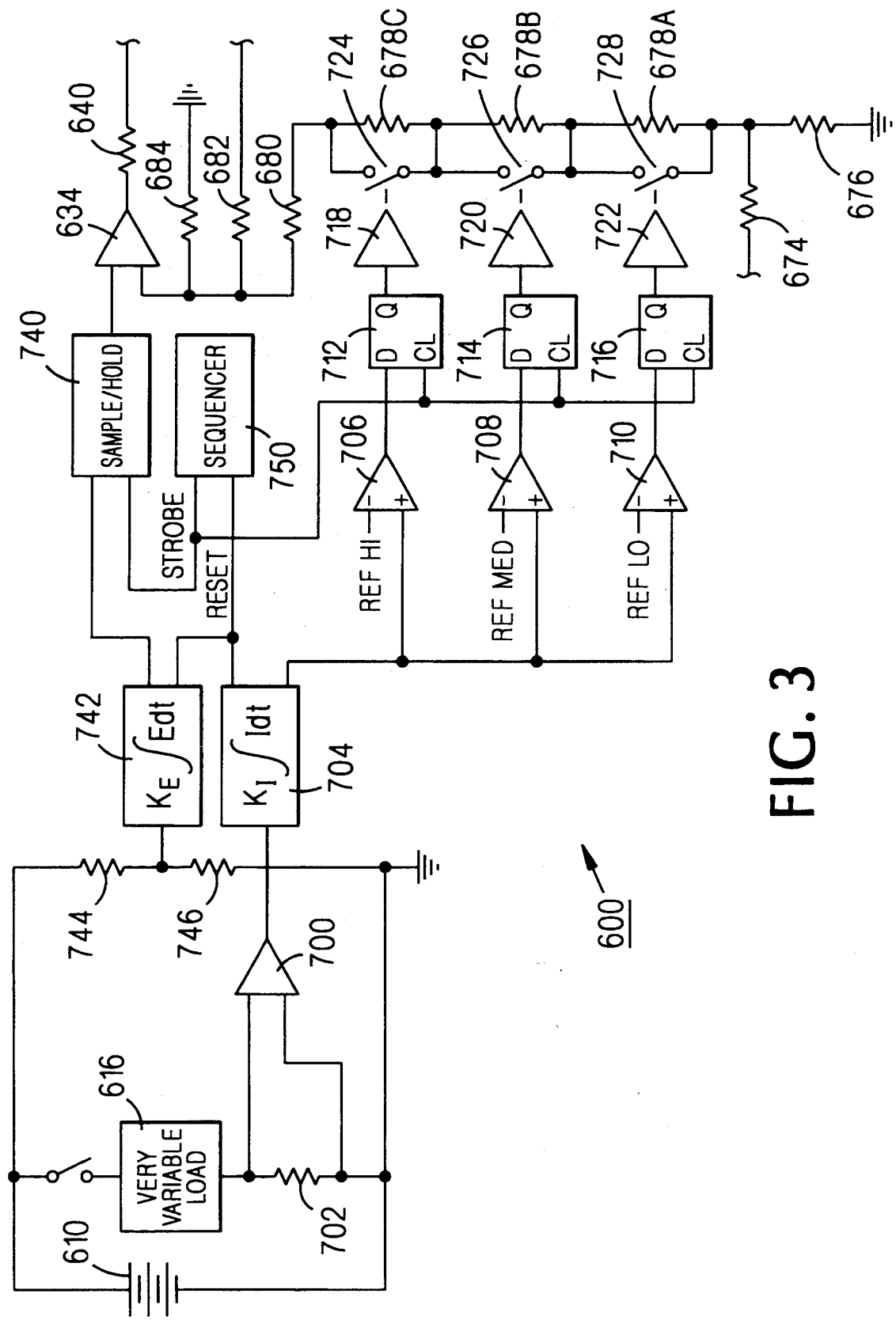
FIG. 3 is a schematic/block diagram illustrating one embodiment of the present invention.
Figure 4:
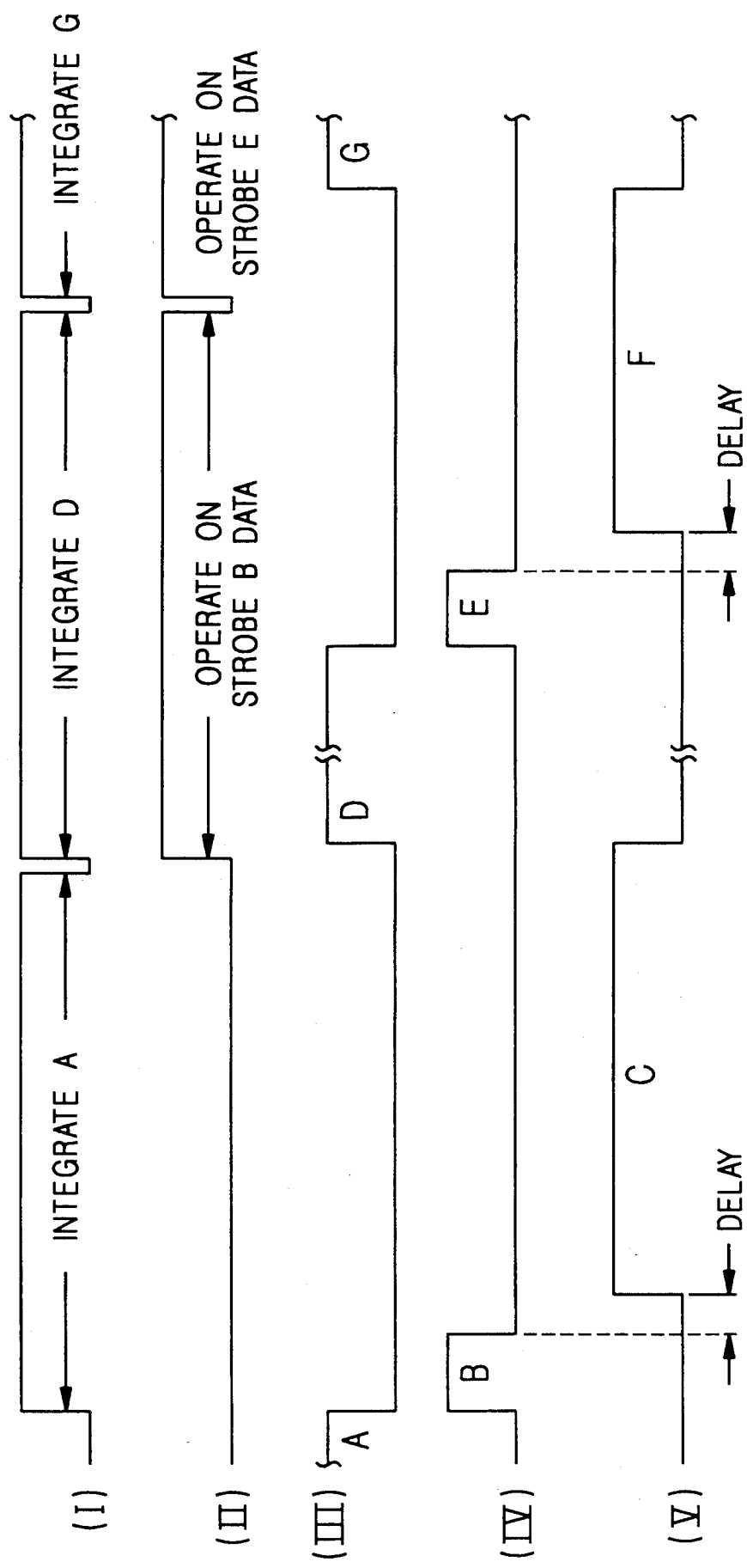
FIGS. 4(A)–4(E) are waveform diagrams illustrating the operation of the embodiment of FIG. 3.

FIG. 3 illustrates one system for adjusting the threshold voltage locus (FIG. 2) as a function of load current, the system being generally indicated by the reference numeral 600. Elements of system 600 common to the elements of the circuitry of FIG. 1 are given the same reference numerals. It will be seen that variable resistor 678 on FIG. 1 has been replaced with a series of switched resistors 678A, 678B, and 678C which are controlled as follows.

A differential amplifier 700 is connected across a low value shunt resistor 702 connected in series with load 616 which load may be assumed to be very variable, as described above. Shunt resistor 702 may simply comprise a section of interconnecting cable with signal wires crimped into end terminations. The output of differential amplifier 700 is inputted to a current integrator 704 which provides an output to comparators 706, 708, and 710, the comparators having high, medium, and low reference voltages, respectively, and the comparators providing data inputs to data flipflops 712, 714, and 716, respectively. Data flipflops 712, 714, and 716 provide inputs to drivers 718, 720, and 722, respectively, which are operatively connected to switches 724, 726, and 728, respectively, the switches being connected, as shown, to selectively short out resistors 678C, 678B, and 678A, respectively.

Current integrator 704 is actually a voltage integrator which calculates the integral of current with respect to time by operating on the current-to-voltage conversation performed by shunt 702.

The input to comparator 634 (FIG. 1) has been removed from lead 632 and tied to an output from a sample/hold amplifier 740 which receives an input from a voltage integrator 742, the voltage integrator receiving an input from a voltage divider circuit comprising resistors 744 and 746 connected in series with battery 610. Sample/hold amplifier 740 also receives a strobe signal from a sequencer circuit 750 which simultaneously strobes data flipflops 712, 714, and 716. Sequencer circuit 750 also provides reset signals to integrators 704 and 742.

Switched resistors 678A–C have four states: A+B+C, B+C, C, and short circuit, the states being set by the data values in data flipflops 712, 714, and 716, with the listing of the above states corresponding to increasing average current flow through shunt resistor 702 and lower average threshold voltage loci (FIG. 2). The main thrust of system 600 is to roughly classify load regimes in which the system of FIG. 1 can operate normally and a high degree of precision is usually unnecessary. However, additional switching resistors could be provided for further refinement. As discussed earlier, the classifications are compromises to accommodate such battery statistics as battery type, battery size, average loading, and desired depth-of-discharge.

Operation of system 600 will be more fully understood with reference to FIGS. 4(A)–(E). Waveform (A) illustrates intervals of integration separated by very short intervals and waveform (B) illustrates the data which is being inputted to threshold comparator 634. Waveforms (C)–(D) are an enlargement of the short intervals between INTEGRATE A/INTEGRATE D and INTEGRATE B/INTEGRATE D on waveform (A), with waveform (C) showing portions of the integration periods, waveform (D) indicating the occurrences of strobes, and waveform (E) indicating periods of reset. Thus, integrators 742 and 704 (FIG. 3) integrate current and voltage, respectively, during interval "A". At the end of interval "A", sequencer 750 strobes data ("B" on waveform (D) from sample/hold circuit 740 to comparator 634. Simultaneously, data flipflops 712, 714, and 716 are strobed and signals therein, if any, are transmitted to drivers 718, 720, and 722 to close switches 724, 726, and/or 728, respectively, providing a feedback reference voltage to threshold comparator 634. Integrators 742 and 704 are reset during interval "C" on waveform (E). Then, current and voltage are, again, integrated over interval "D" while digital circuit unit 642 operates normally using the "B" strobed information.

Then, current and voltage are integrated over interval "D", strobed at "E", threshold comparator receives the "E" strobe data, and integrators 742 and 704 are reset during interval "F" and the process continued.

The "B", "E", etc. strobes can be relatively short, on the order of about 10–100 microseconds, as they merely must command the current latches and the voltage samples prior to integrator resets during "C", "F", etc. A short delay on the order of about 1–10 microseconds may separate the strobes and resets to preclude any error resulting from RESET starting before "hold" is fully established. Sample/hold amplifier 740 samples and settles during the strobe pulse and holds during the zero interval. The total time allocated for STROBE, DELAY, and RESET should be less than one percent of the full cycle; therefore, the reset should be less than 890 microseconds for a worst case consisting of a 100 millisecond cycle time, 100 microsecond strobe, and 10 microsecond delay.

Figure 5:
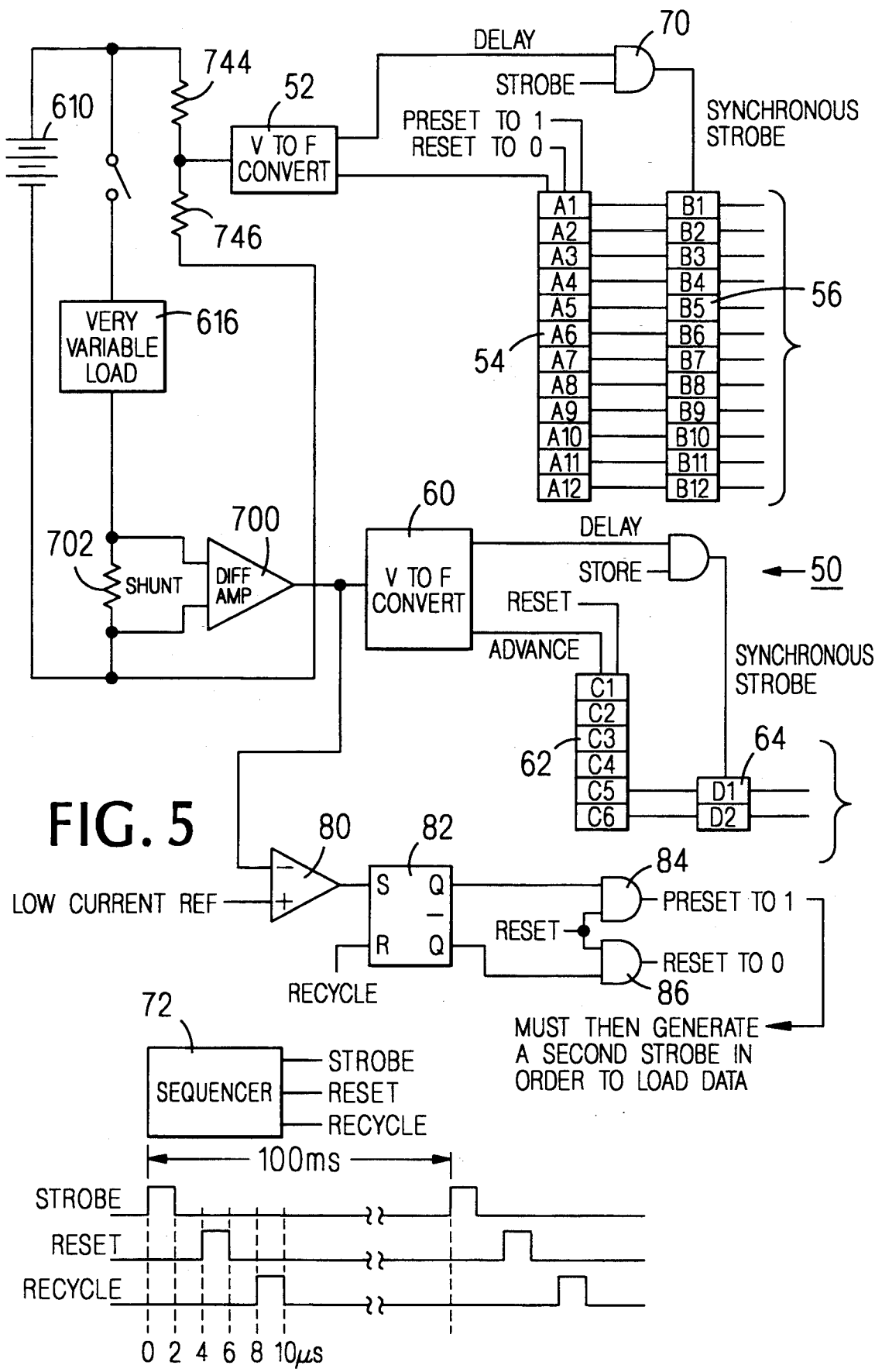
FIGS. 5(A) and 5(B) are schematic/block and timing diagrams, respectively, illustrating another embodiment of the present invention.
Figure 6:
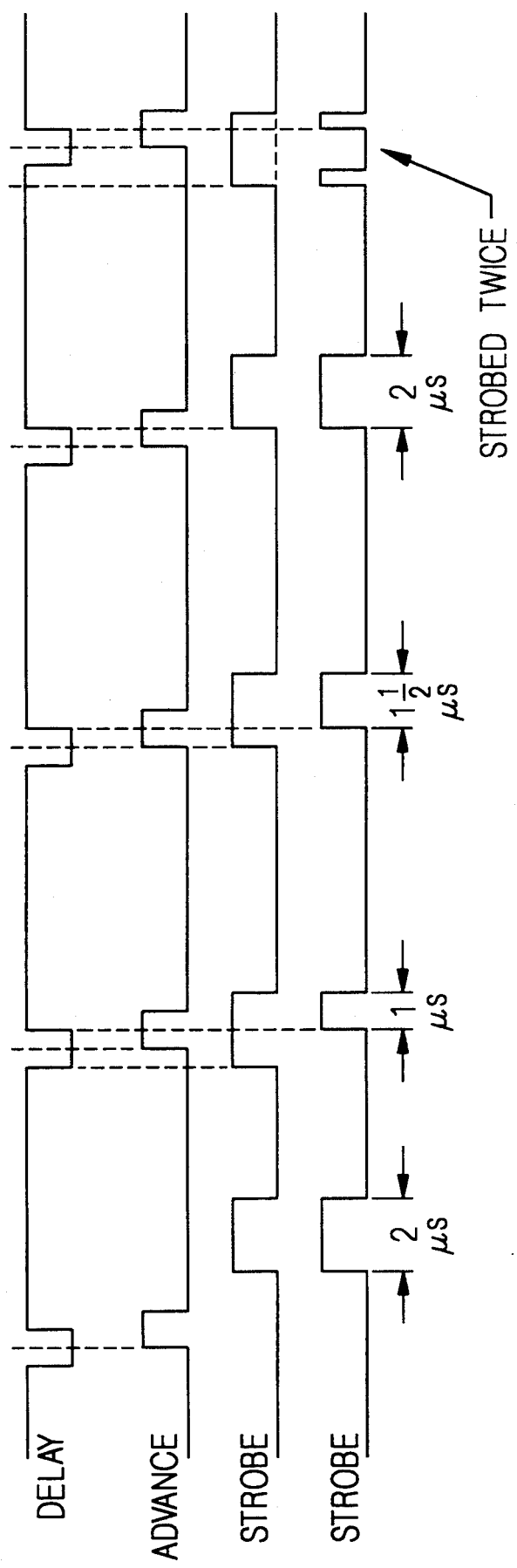
FIGS. 6(A) and 6(B) are waveform diagrams illustrating the operation of a portion of the embodiment of FIG. 5.

FIG. 5(A) and 5(B) illustrates a system, similar to system 600 on FIG. 3, but in which integration is digital, generally indicated by the reference numeral 50, where the input voltage integrator comprises a voltage-to-frequency converter 52 and a binary counter 54, the binary counter being connected to a latching register 56. The input current integrator is a voltage-to-frequency converter 60 and a binary counter 62, the binary counter being connected to a latching register 64. An AND gate 70 receives a delay signal from voltage-to-frequency converter 52 and also receives a strobe signal from a sequencer 72. AND gate 70 then outputs a strobe signal to transfer accumulated data from binary counter 54 to latching register 56, the strobe signal being synchronized with the "advance" pulses from the converter. The output of latching registers 56 represents average battery voltage over the interval from the fall of RESET to the rise of STROBE presented in 12-bit binary form and may be received by a digital-to-analog converter (not shown) for use in system 600 (FIG. 3) or the output may be a direct digital input within a microprocessor based design (not shown), for the subsequent normal integration cycle of the system of FIG. 1. The output from latching register 64 provides four levels of current defined in two-bit binary form and is used in a similar manner for the selection of feedback resistance in system 600 (FIG. 3). The intrusion into the input integration cycle is quite minimal, typically less than 0.01 percent (10 microseconds out of 100 milliseconds). Latching register 56 must have relatively high resolution, usually all bits. Latching register 64 may have only two bits.

System 50 provides for omitting any cycle in which current drops to zero. A comparator 80 is connected to receive the output of differential amplifier 700 and to receive a low current reference voltage. The output of comparator 80 is connected to flipflop 82 which provides inputs to AND gates 84 and 86 upon receiving a RECYCLE signal. Normally, upon receiving a RESET signal, AND gate 86 will output a RESET TO 0 signal to binary counter 54 which resets to zero. If, however, a low current condition is detected during a cycle, AND gate 84 will output a RESET TO 1 signal which drives the A counter to all "1"s, thus creating an impossibly high fictitious voltage, which causes digital circuit unit 642 (FIG. 3) to skip any cycle where the current has dropped to essentially zero sometime during the cycle. The current integral in the latter case is assumed to be corrupt.

Creating synchronous strobes is required to prevent strobing data from the "A" or "C" binary counters into the "B" or "D" latching registers when the counters are in transition. The strobe signal is asynchronous with the advance pulses from the voltage-to-frequency converters and could occur while the counters are rippling through. This condition can be prevented by delaying the strobe slightly during such occurrences, as is described above. The voltage-to-frequency converters generate a positive advance pulse precessed in time from a concurrent negative delay pulse. The timing diagram shown on FIGS. 6(A)–(D) describes five conditions. The first condition illustrates when ADVANCE and STROBE events are far apart. The remaining four conditions show accidental edge alignments and illustrate the salutary effect of the delay when accidental edge alignments occur. The delay and advance are 1 microsecond wide each with ½ microsecond overlap. The strobe is 2 microseconds wide. The counters advance on the leading edge of ADVANCE and strobing into latches occurs on leading edge of SYNCHRONOUS STROBE.

Figure 7A:
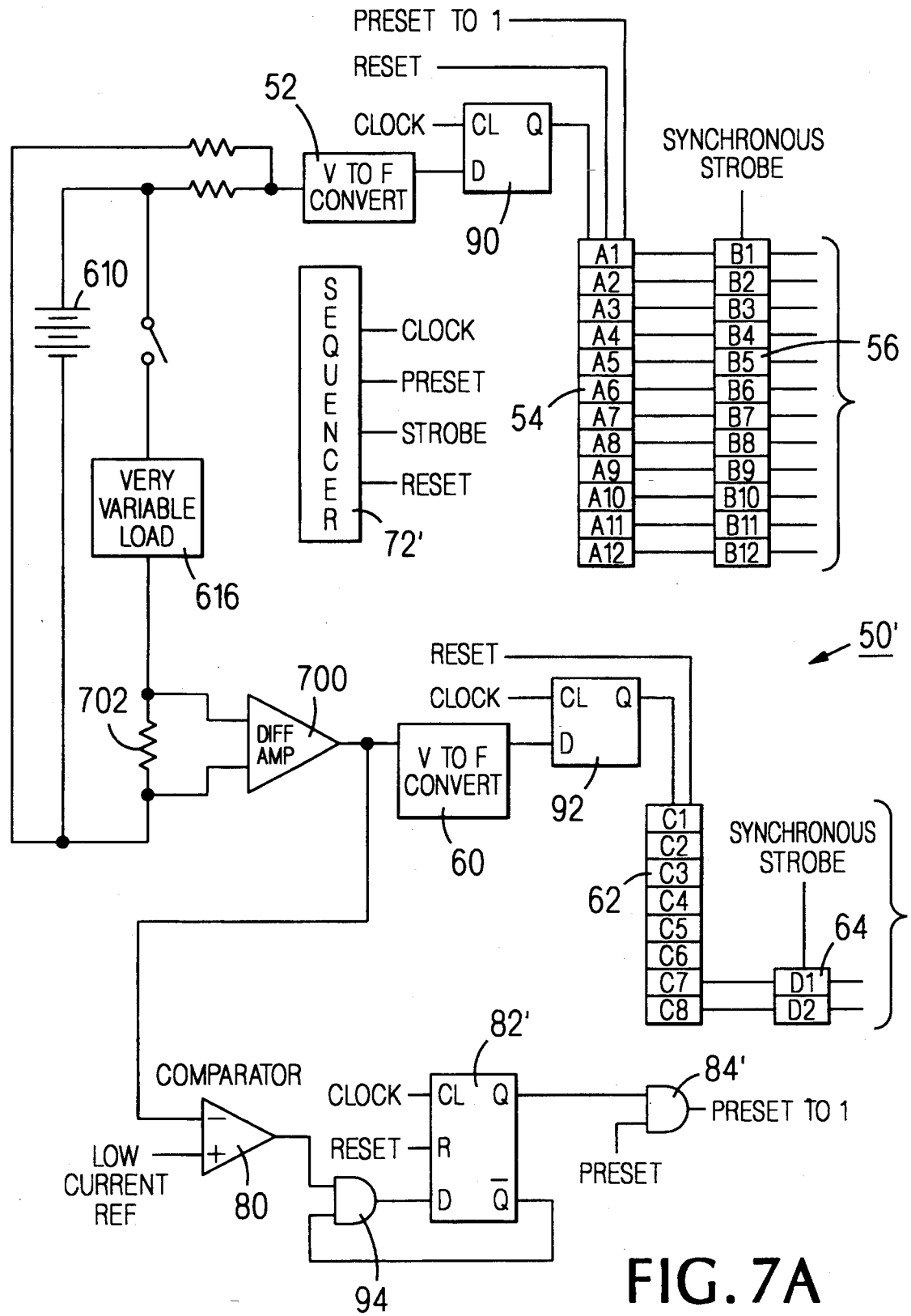
FIGS. 7(A) and 7(B) are schematic/block and timing diagrams, respectively, illustrating an additional embodiment of the present invention.
Figure 7B:
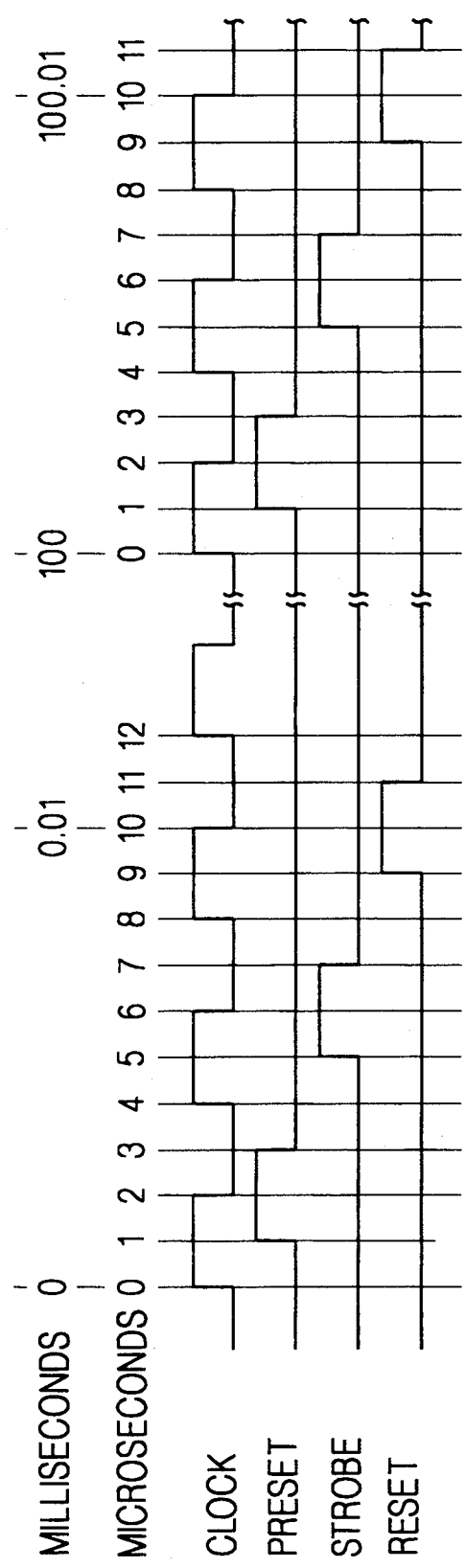

FIGS. 7(A) and 7(B) illustrates a system similar to system 50 (FIGS. 5(A) and 5(B)), generally indicated by the reference numeral 50′, in which synchronous strobes are generated by synchronizing the ADVANCE outputs to a clock precessed from STROBE. A data flipflop 90 receives a input from voltage-to-frequency converter 52 and the data is transferred to binary counter 54 upon receipt of a precessed clock pulse. A data flipflop 92 similarly transfers data to binary counter 62 from voltage-to-frequency converter 60. A low current condition is again detected by comparator 80 which provides an input to an AND gate 94, coupled to a data flipflop 82′, which AND gate also receives as an input the inverting output of the data flipflop. The output of data flipflop 82′ is an input to an AND gate 84′ which also receives a PRESET signal. If a low current condition exists during a cycle, the RESET signal to data flipflop 82′ will output a signal to AND gate 84′ which will output a PRESET TO 1 signal upon receipt of a PRESET signal.

A 250 KHz clock runs continuously and all clock advances and strobing are on rising edges. PRESET and RESET occur during positive clock pulses. Voltage-to-frequency pulse width should be five microseconds minimum. Thus, the output of latching counters 56 is the average battery voltage integrated over 99.993 milliseconds (100 milliseconds−7 microseconds), less the digitizing error involved in synchronization.

Figure 8:
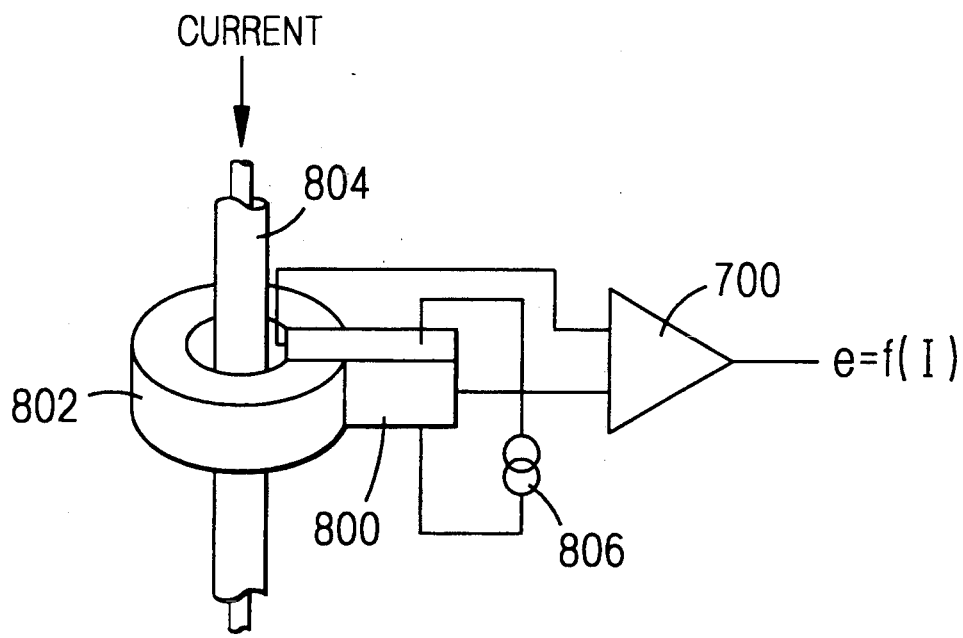
FIG. 8 is a schematic/block diagram illustrating a further embodiment of the present invention, including a contactless (isolated) current related input.

The above embodiments of the present invention described measuring current across shunt resistor 702. Alternatively, a Hall effect current sensor may be placed adjacent or surrounding a current carrying conductor without making physical contact therewith, and such is shown on FIG. 8. Here, one end of a Hall effect sensor 800 is inserted in a gap of a flux concentrating core 802 encircling a current carrying conductor 804 (with insulation intact), with the latter assumed to be a power cable connected to a battery being monitored (not shown). Hall effect sensor 800 operates on Ampere's Law which states that the line integral of the magnetic field is proportional to the net current flow through the central aperture of core 802 and the sensor transduces the product of the perpendicular magnetic flux and the bias current generated by current generator 806 into a third, perpendicular Hall voltage. The latter, relatively low voltage is multiplied by differential amplifier 700 to the much higher level required by current integrator 704 (FIG. 3), for example.

Such sensors are quite inexpensive, but they suffer from poor accuracy in terms of both offset and gain. However, in a two or three classification zone system, their accuracy is sufficient. Current consumption of such sensors tends to be high, but this is of little importance in industrial vehicles such as forklift trucks.

Figure 9:
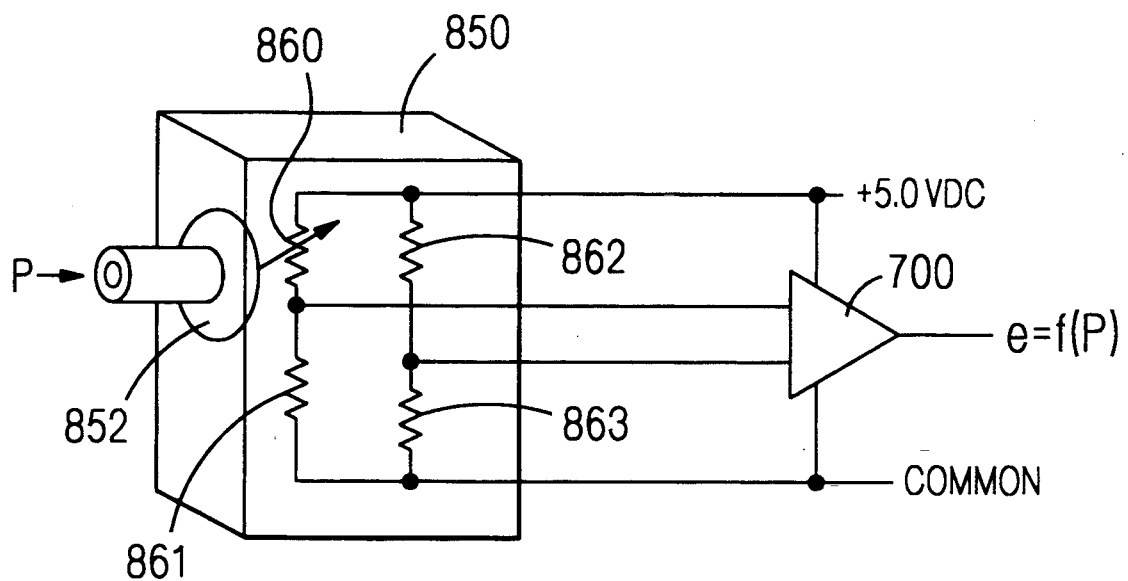
FIG. 9 is a schematic/block diagram illustrating yet another embodiment of the present invention, including a pressure related input.

While the foregoing embodiments of the present invention have employed measurement of current flow as the primary input, in some applications motive power is supplied by one or more hydraulic pumps the output pressure of which relates to force and work which, in turn, relate to power and load. Therefore the pressure is a function of battery current and, thus, the pressure can be used for load classification. FIG. 9 illustrates such an arrangement in which there is provided a pressure transducer 850 which includes a diaphragm 852 therein to flex in response to pressure "P" received from a hydraulic line (not shown). The flexure unbalances an arm of a piezoresistive bridge comprising four resistors 860–863 and the unbalance is measured and amplified differentially by differential amplifier 700 to produce an output proportional to the input pressure and, therefore, proportional to battery current.

Figure 10:
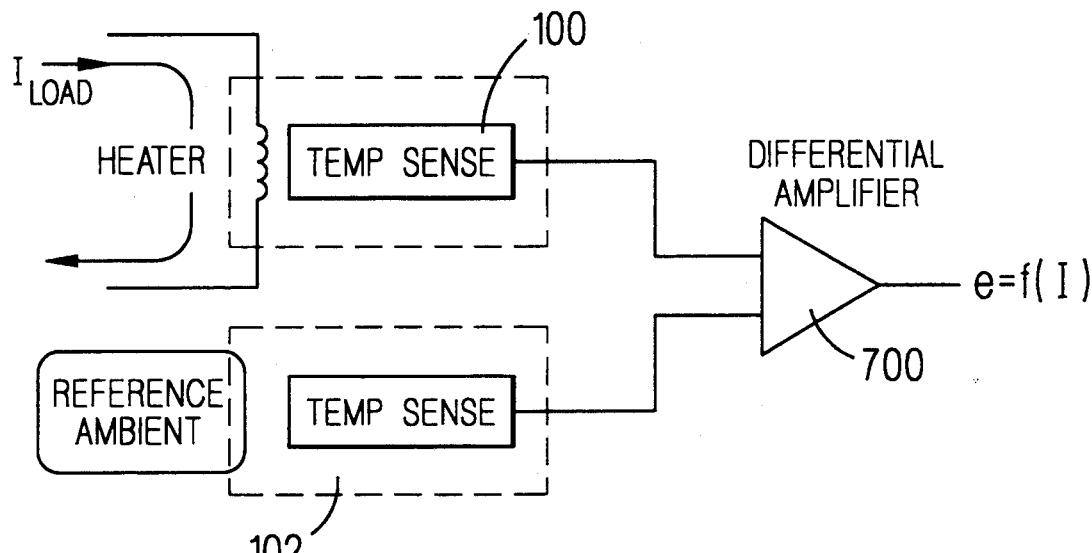
FIG. 10 is a schematic/block diagram illustrating yet an additional embodiment of the present invention, including a temperature related input.

It is also possible to provide other inputs related to battery current, such as the temperature rise of a component or a conductor. FIG. 10 illustrates such an arrangement in which differential amplifier 700 receives inputs from a temperature sensing device 100 in proximity to a device heated by load current and from a temperature sensing device 102 sensing ambient temperature. This arrangement is particularly effective when loading is prolonged such that the thermal time constant falls well within the realm of the day's integration. These might be a two-minute time constant and two-hour integrals, for example. The situation can be forced a bit by using an element with a fast time constant such as a fuse or a purposeful constriction. This arrangement is best used with a small number of classification zones, such as two or three. It is also possible to monitor only the element that produces an extreme shift in loading for a very effective two-zone scheme. Thermal sensors 100 and 102 can be band gap silicon sensors, silicon resistors, silicon P-N junctions, thermistors, thermocouples, or high temperature coefficient wires, for example.

Figure 11:
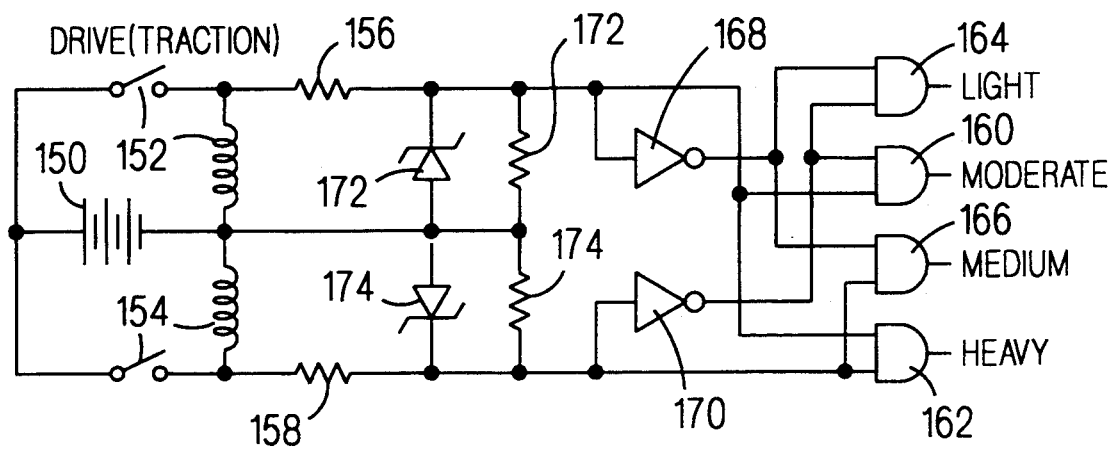
FIGS. 11(A) and 11(B) are schematic/block diagram and an operating matrix, respectively illustrating yet a further embodiment of the present invention, including a switch controlled input.

It is also possible to derive a load classification from system controls and this can be very simple and inexpensive in certain applications. For example, in some industrial vehicles, such as forklift trucks, there are two or three power hogs that dominate the picture. To take a simple case, it may be known that the traction loads of a forklift truck average 50 to 200 amperes, that the lifting loads average 150–500 amperes, and that the two loads can occur simultaneously, as is indicated in the table on FIG. 11. Referring to the circuit illustrated on FIG. 11, contactors 152 and 154, each including a switch and a relay coil, are connected across a battery 150 to provide power to drive and lift motors (not shown), respectively, of a forklift truck (not shown). Resistors 156 and 158 drop the battery voltage to about the level of a logical "1" for electronic logic components. When contactor 152 is closed, a direct current signal, logical "1" is applied directly to the inputs of AND gates 162 and 164 and a logical "0" is applied to AND gates 164 and 166 through an inverter 168. When contactor 154 is closed, a direct current signal, logical "1" is applied directly to AND gates 162 and 166 and a logical "0" is applied to AND gates 160 and 164 through an inverter 170. Thus, opening and/or closing of one or both contactors 152 and 154 provides one of the output load classifications listed. Shunt resistors 172 and 174 are provided to create logical "0"s, respectively, when contactors 152 and/or 154 are open. Zener diodes 172 and 174 are provided to protect the logic circuitry against damage from voltage spikes.

Figure 12:
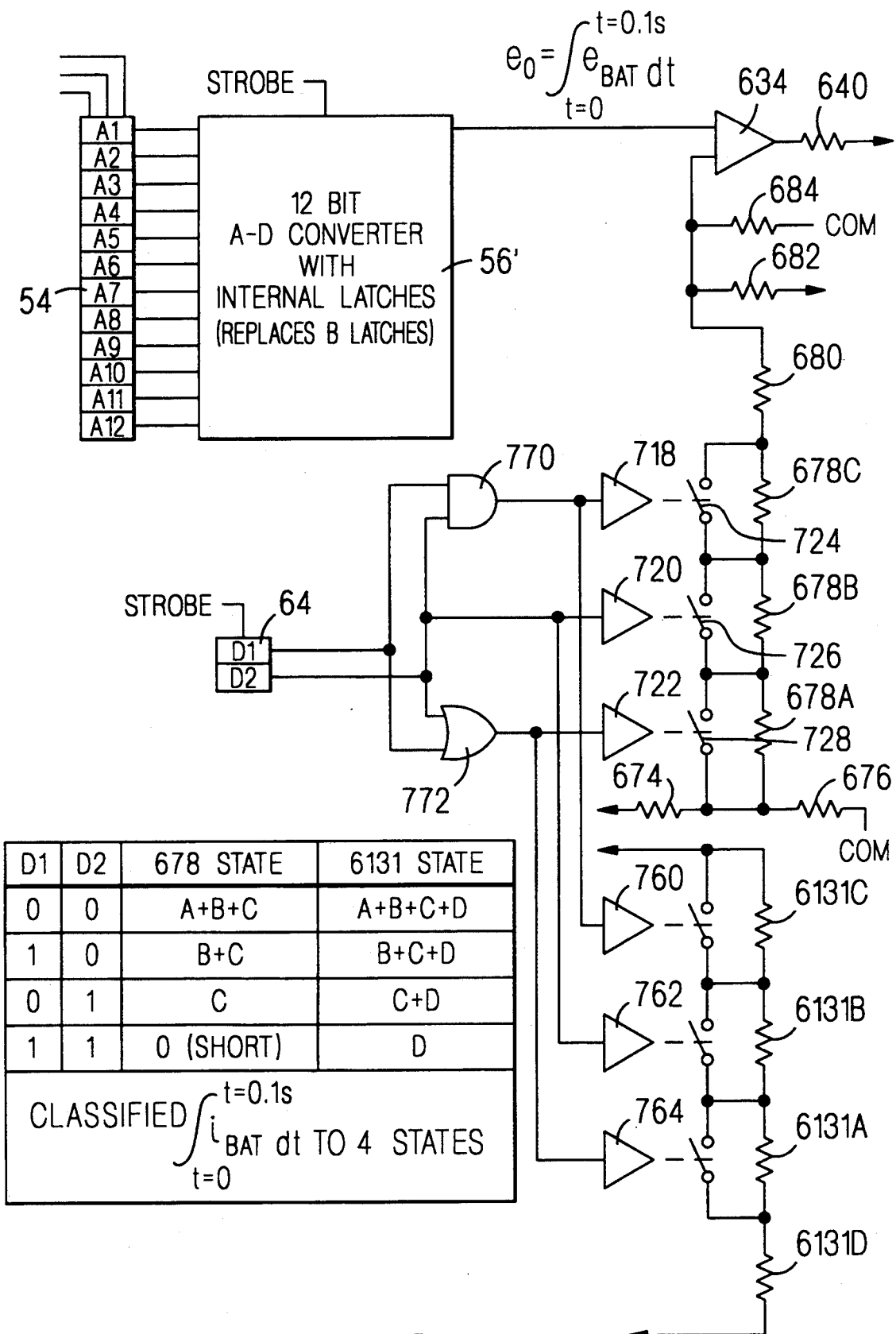
FIGS. 12(A) and 12(B) are a schematic/block diagram and an operating matrix, respectively, illustrating another embodiment of the present invention.

System 600 on FIG. 3 illustrates a direct interface to the integration feedback transform only. FIG. 12 illustrates circuitry interfaced with systems 50 or 50' (FIGS. 5(A) and 5(B) and FIGS. 7(A) and 7(B) whereby the smoothing for any particular load regime can be improved by adjusting the integration rate commensurate with that regime, as well as the integration feedback transform. Here, resistor 6131 (FIG. 1) of digital circuit unit 642 has been replaced with switched resistors 6131A–C plus resistor 6131-D to provide selective adjustment of the master oscillator period over a range of interest, in the same manner as variable resistor 678 was replaced with switched resistors 678A–C. Resistors 6131A–C are operatively connected to drivers 764, 762, and 760, respectively, which drivers are connected to latching register 64 through an AND gate 770 and an OR gate 772 to provide the progression shown in the logic table.

A variation from systems 50 and 50' (FIGS. 5(A) and 5(B) and FIGS. 7(A) and 7(B) is that latching register 56 has been replaced with an analog-to-digital converter 56' having internal latches.

The circuitry shown on FIGS. 12(A) and 12(B) smooths one- to two-hour work cycles with, say, ⅜- to ⅝-hour open loop integration times, whereas 5- to 8-hour work cycles are smoothed better at, say, 2- to 3-hour open loop integration times. The circuitry can be tuned to a high degree of accuracy and linearity by adjusting feedback transform shape against real time rates.

A drawback with altering the master oscillator is that other functions such as reset routines and alarm signals will vary in frequency. In practice, this is compensated for by shifting the frequency internal to digital circuit unit 642 (FIG. 3) to a point where it impacts only the integration rate. A digital switching network can be employed for this function.

While FIGS. 12(A) and 12(B) illustrates an embodiment of the present invention in which both integration feedback transform and integration rate are adjusted with respect to load, there can be situations in which adjustment of integration rate only will provide acceptable performance and such is within the scope of the present invention. Such an arrangement can be implemented especially easily in a microprocessor-based implementation. With reference to FIG. 12, the 6131 state would be varied, while the 678 state would remain constant.

Another system for which the present invention has applicability is described in U.S. Pat. No. 4,017,724, issued Apr. 12, 1977, to Eugene P. Finger, and titled APPARATUS FOR MEASURING BATTERY DEPLETION BY MONITORING REDUCTIONS IN VOLTAGE, the disclosure of which is incorporated by reference hereinto. The apparatus therein described comprises means for sensing reductions in the output terminal voltage of a battery due to varying load conditions and producing a signal in response thereto during the time that the terminal voltage of the battery is below a threshold value. The apparatus further comprises integrator means such as an electronic counter or stepping motor for integrating the signal and means for displaying the integral accumulated by the integrating means.

Figure 13:
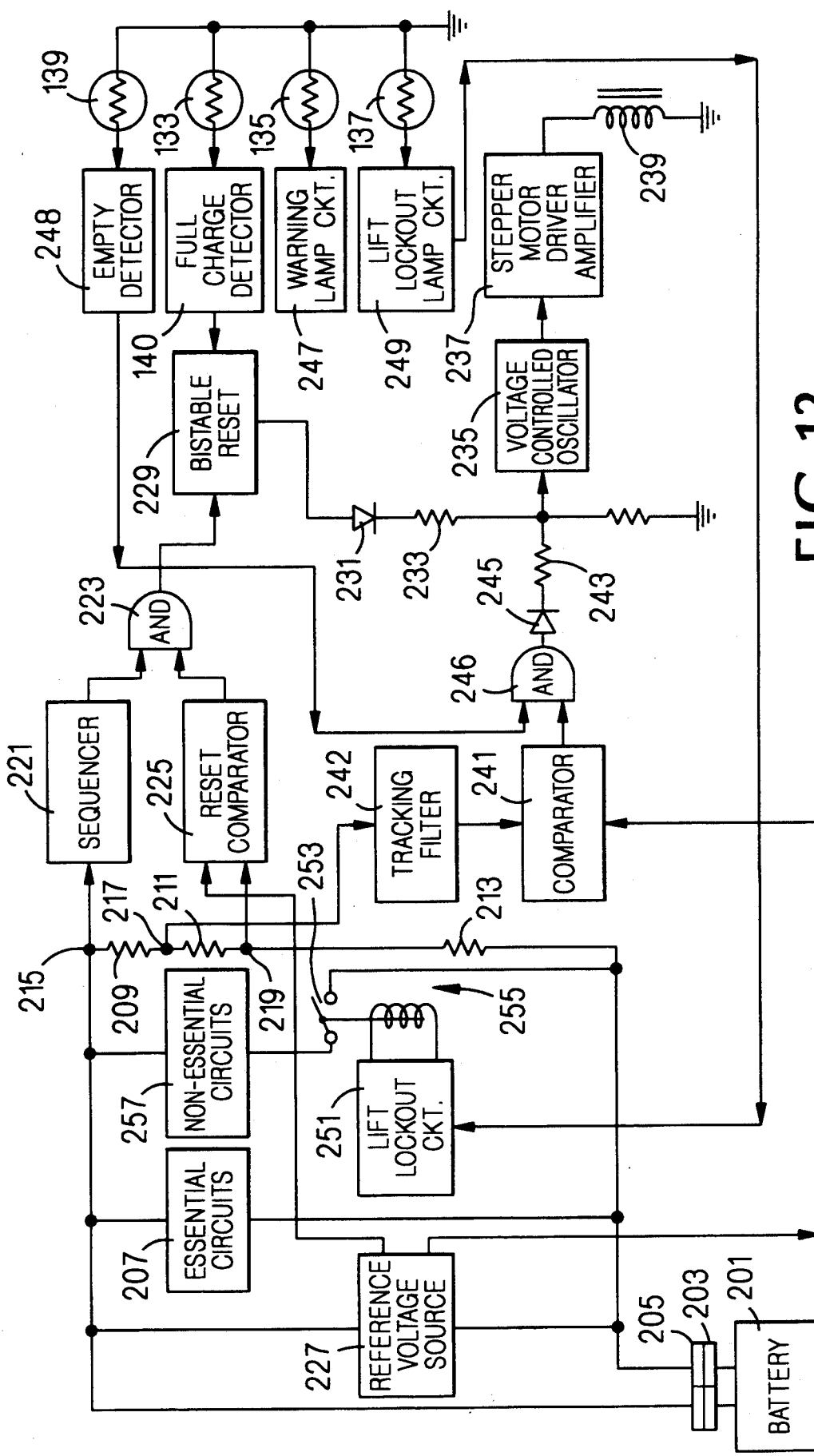
FIG. 13 is a schematic/block diagram illustrating another battery monitoring system to which the present invention may be applied.
Figure 14:
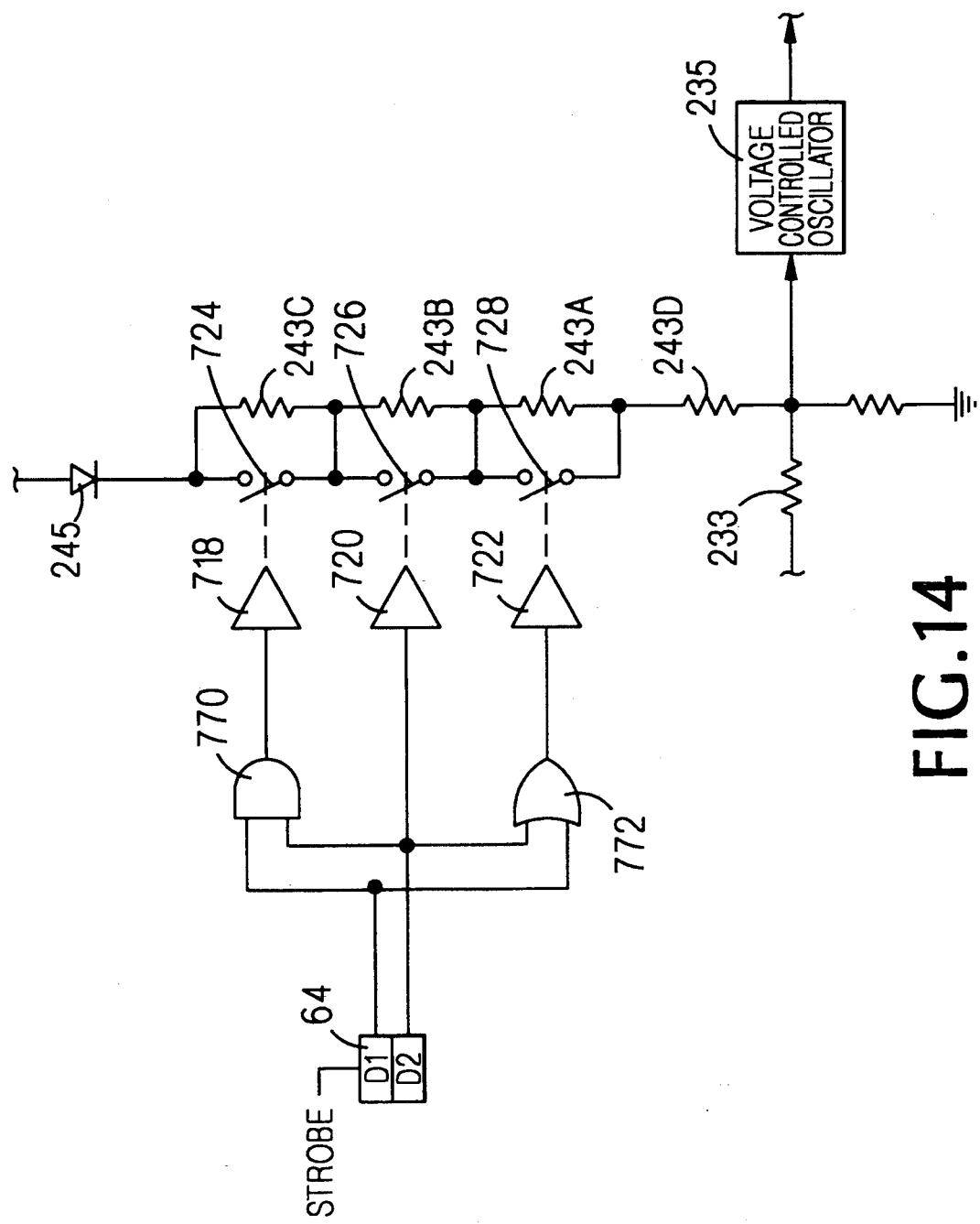
FIG. 14 is a schematic/block diagram illustrating the application of the present invention to the system of FIG. 13.

FIG. 13 is a reproduction of FIG. 7 of the foregoing patent and includes a voltage controlled oscillator 235 which provides a signal to a stepper motor driver amplifier 237 which drives a stepper motor (not shown on FIG. 13) which is coupled to and rotates a "fuel gauge" from "full" to "empty" as a battery 201 is depleted. A comparator 241 compares the output voltage of battery 201 with a reference voltage 227 and provides a voltage input to voltage controlled oscillator 235 through a resistor 243 when the output voltage of the battery drops below a predetermined threshold. By replacing resistor 243 with a series of stepped resistors 243A–C plus resistor 243–D, and interfacing them with the integration circuitry of FIG. 12(A), as is indicated on FIG. 14, the rate of change in the fuel gauge reading can be selectively varied depending on the classification of load conditions, as is described in more detail above.

Another system in which the present invention is applicable is described in U.S. Pat. No. 4,193,026, issued Mar. 11, 1980, to Eugene P. Finger, and titled METHOD AND APPARATUS FOR MEASURING THE STATE OF CHARGE OF A BATTERY BY MONITORING REDUCTIONS IN VOLTAGE, the disclosure of which is incorporated by reference hereinto.

The apparatus described therein comprises threshold means for sensing reductions below a threshold level in the output terminal voltage of the battery and for producing a signal in response thereto and means for integrating the signal over a plurality of such reductions.

Figure 15:
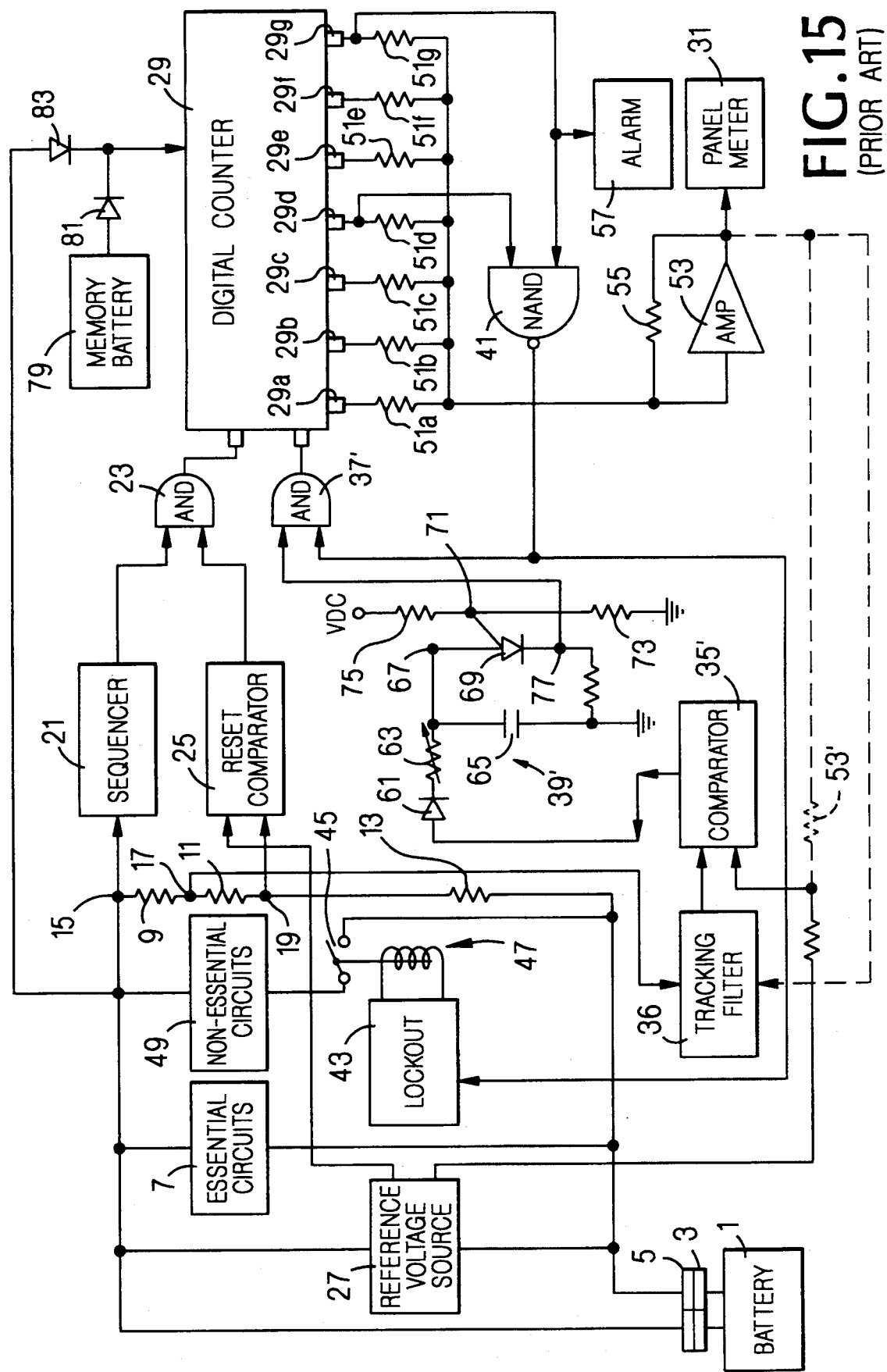
FIG. 15 is a schematic/block diagram illustrating an additional battery monitoring system to which the present invention may be applied.

FIG. 15 hereof is a reproduction of FIG. 2 of the foregoing patent and includes a tracking comparator 35' which compares the output level of a battery 1 to a reference voltage source 27. A self-resetting integrator 39' produces a train of pulses in response to tracking comparator 35', the rate of which is determined by variable resistor 63. Tracking comparator 35' also receives an input from feedback resistor 53'. It can be seen that variable resistor 63 and feedback resistor 53' are directly analogous to resistors 6131 and 678, respectively, of the system of FIG. 1 and, therefore, can be replaced with series of switched resistors 678A–C and 6131A–C plus resistor 6131–D in the manner shown on FIG. 12.

Figure 16:
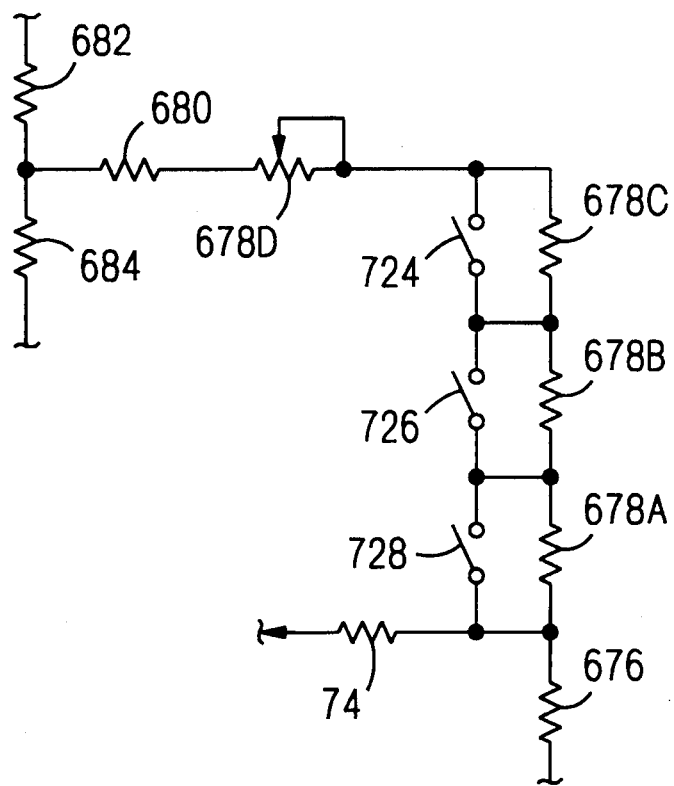
FIG. 16 is a schematic diagram illustrating an additional embodiment of the present invention.

In the system of FIG. 1, a single adjustment is used to accommodate both loading statistics (i.e., type of use) and desired depth-of-discharge. This is done for low cost and simplicity. The feedback transform typically translates and rotates simultaneously via a single potentiometer adjustment, resistor 678. In another aspect of the present invention, a second adjustment for use selection of depth-of-discharge independent of automatic rate correction is shown on FIG. 16. Here, a variable resistor 678D is placed in series with switched resistors 678A–C as a modification to the arrangement shown on FIG. 3. Series/parallel combinations and variable adjustment of resistors 682 and/or 684 are other possibilities depending upon specific loading statistics of the battery being modeled. As noted earlier, these loading statistics include battery type, battery size, and average loading, in addition to desired depth-of-discharge.

The above embodiments of the present invention are directed to operating on the main integrator to vary inputs thereto or to vary the integration rate thereof. A somewhat superior approach, in some cases, would be to permit the main integrator to range over the full capacity of the battery, but to calibrate the output circuitry to display only the region which the user chooses to describe as the nominal capacity, e.g., 60%, 70%, 80%, or etc. of rated range/capacity.

Figure 17:
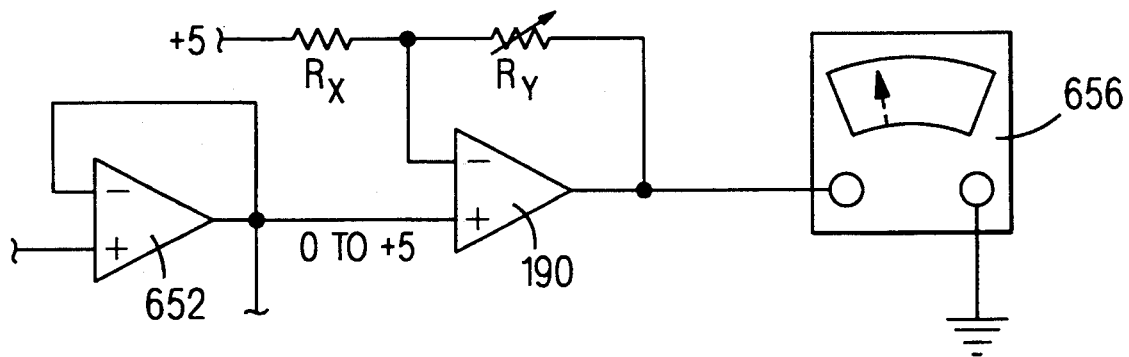
FIG. 17 is a schematic diagram illustrating a further embodiment of the present invention.

Referring again to FIG. 1, the demodulated signal at the output of amplifier 652 would be the entire battery range, where 0 volts="empty" and +5 volts="full". Broken line 654 can be replaced with the circuitry shown on FIG. 17. Here, a single variable gain amplifier 190 is connected to the output of amplifier 652 to provide an input to voltmeter 656. The +5 volts is conveniently derived from the DC input to digital circuit unit 642, as this voltage is precisely equal to the "FB" output when the main integrator is full. Typically, the gain of the amplifier may vary from 1.0 to 2.0 by varying $R_Y$ from 0 to $R_X$ Ohms. The user selects the percentage (P) of the battery's capacity the user wishes to define as "empty" and sets $R_Y$ to a value equal to $R_X [(100-P)/P]$. For example: for 80%, $R_Y=R_X/4$; for 60%, $R_Y=2R_X/3$; for 100%, $R_Y=0$; and for 50%, $R_Y=R_X$.

PRINCIPLE OF OPERATION AND UNIVERSAL ALGORITHMS FOR LOAD CONTROLLED AUTOMATIC ADJUSTMENT OF 933 TYPE BATTERY DISCHARGE INDICATORS

1.0 GENERAL

Each of the systems illustrated in FIGS. 1 and 13 is also referred to herein as a "933 system". These systems can be modified for automatic adjustment through use of the teachings set forth above which employ relatively imprecise (5 to 10% maximum error) load related signals as correction inputs according to the general method and a number of explicit apparatus modifications to the 933 systems. These and other composite systems are sometimes hereinafter referred to as the "AA933" (Automatic Adjustment 933).

Sections 2.0 through 5.0 further describe the AA933 method and Apparatus in terms of algorithms and procedures which permit direct implementation within a general purpose computer or microprocessor based central processing unit. They illustrate a practical example of load control where the load correction input is battery current.

2.0 BLOCK DIAGRAM AND SCALING RULES FOR A 48 VOLT LEAD ACID BATTERY IN THE 500 TO 800 AMPERE-HOUR RANGE

Figure 18:
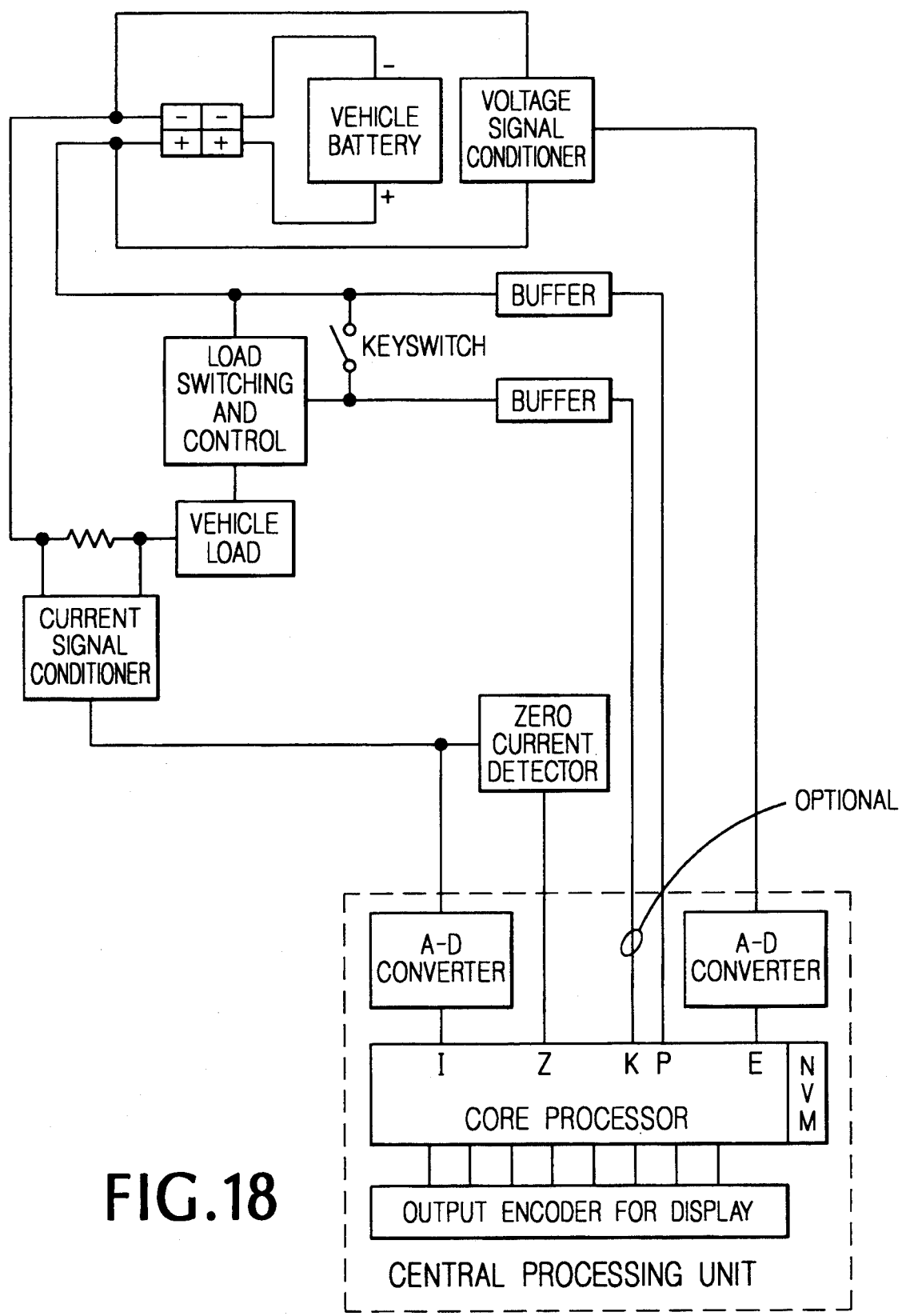
FIG. 18 is a block diagram illustrating the present invention controlled by a CPU.

The Block Diagram shown in FIG. 18 is at the most fundamental level required to accurately support all aspects of the AA933 method. The two critical signal paths through the voltage signal conditioning circuit and the current signal conditioning circuit require quality potentiometric input terminations. The voltage signal inputs should come from vehicular system nodes as close to the battery connector as possible. The current signal inputs should come from an integrated cable assembly with sufficient tolerancing controls on length, cross sectional area, and termination integrity to assure that the resultant voltage drop at the potentiometric signal wires is accurate to ±10% over the anticipated operational cable temperature range.

The central processing unit is shown including the A-D converters and the output encoder. They could, of course, be separate elements. The signal conditioning and zero current detection functions are shown in their most likely positions (external to the CPU).

2.1 CABLE SHUNT

From a practical standpoint the signal levels should be on the order of 100 to 200 millivolts at peak current to minimize the effects of thermal voltages, noise, signal conditioning offset voltage, etc. Care should be taken to minimize the number of dissimilar metal connections, and if they must occur they should be isothermally paired within the potentiometric loop. Unbalanced Seebeck voltages on the order of tens of microvolts per differential degree Celsius may result, which can have a major effect on low current error and on zero current detection.

For the design example contained herein a one (1) meter long 000 AWG (American Wire Gauge) cable will be used. At +25° C. the nominal resistance is 206.6 micro ohms, and produces a 103.3 millivolt drop at 500 amperes and +25° C. This drop will swing approximately ±6% for a cable temperature swing of ±15° C.

2.2 CURRENT SIGNAL CONDITIONER

The primary function of the current signal conditioner is to raise the relatively low shunt voltage to a higher level for use by the A-D converter. For this design example a 5.00 volt = 500 amperes scaling factor will be used. Therefore the gain of the current signal conditioner = 5000 mV/103.3 mV = 48.4. The signal conditioner may also contain low pass filtering as determined by practical noise and A-D considerations.

The zero current detector can also benefit from using the higher level output signal provided that filter requirements do not conflict with tracking (Refer to 2.3).

2.3 ZERO CURRENT DETECTOR

The primary function of the zero current detector is one or continuous zero (very low) current surveillance for the purpose of casting out corrupted A-D integration intervals. The only data the AA933 should act upon during its voltage-under-load operation is continuous load data. To this end, the zero current detector should be able to track reasonably fast relative to the A-D integration interval. If the current signal conditioner's filter precludes meeting this requirement the input(s) to the zero current detector will have to be moved forward to read the shunt directly, with the disadvantage of working from low levels.

A secondary function of the zero current detector may enter into a sub algorithm involving inactive battery monitoring (Refer to 5.0).

The zero current detector should reliably detect the near-zero condition taking into account all offset and temperature dependent errors. A trigger level on the order of 500 microvolts to 1 millivolt referred to the shunt (approximately 25 to 50 millivolts referred to the output of the current signal conditioner) is practical.

2.4 VOLTAGE SIGNAL CONDITIONER

Figure 19:
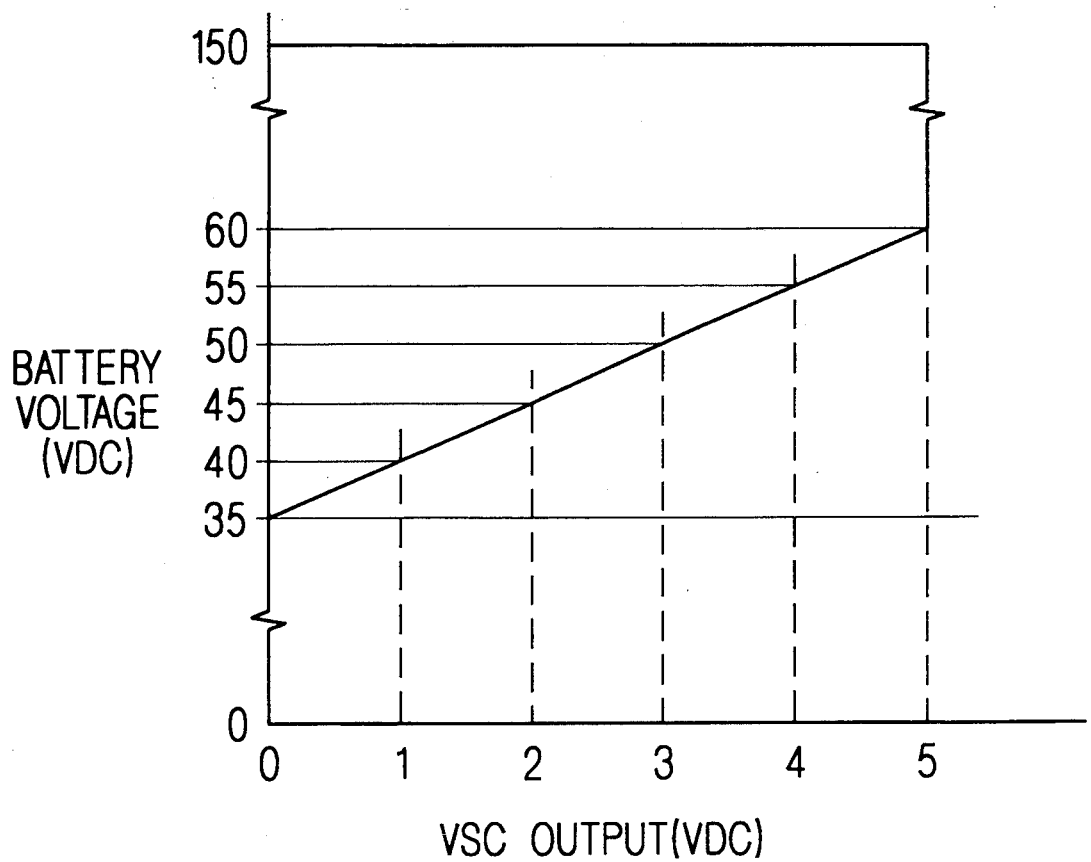
FIG. 19 graphically illustrates a voltage signal conditioner transform for the system of FIG. 18.

The primary function of the voltage signal conditioner is to precisely rescale the actual battery voltage range to an optimum voltage range for the A-D converter. Its secondary functions provide low pass filtration and transient protection. It is important that voltage measurements be made to a much higher precision than current measurements. As a goal voltage measurement error should be held to ±0.3% with a worst case error budget over the operating temperature regime on the order of ±0.7%. To this end, it is recommended that the voltage signal conditioner provide a clipped expanded scale input to the D-A converter, effectively increasing the D-A converter bit range relative to a zero based measurement. FIG. 19 shows a typical transform restricting the output to the battery voltage range of interest to the AA933. It includes HVR (See 3.3) at the high voltage extreme and completed high rate discharge (See 4.0) at the low voltage extreme.

2.5. A-D CONVERTERS (ANALOG-TO-DIGITAL CONVERTERS)

The A-D converter associated with the current signal can operate with very few bits, as it is involved merely with a classification process. For this design example it will be assumed that it is a 6 bit converter operating on a 20 millisecond integration/conversion cycle.

The voltage signal A-D converter must, however, preserve the 0.3% error goal when working in conjunction with the expanded signal from the voltage signal conditioner. This is easy to achieve with a 10 bit converter, but may be achieved with an 8 bit converter by carefully treating all the elements within the temperature inclusive 0.7% overall error budget. For this design example it will be assumed that it is an 8 bit converter operating on a 20 millisecond integration/conversion cycle. The converters may be integrated within the CPU, as shown, or may be discrete external elements (or an 8 bit on-board and 10 bit off-board, etc.).

Figure 20:
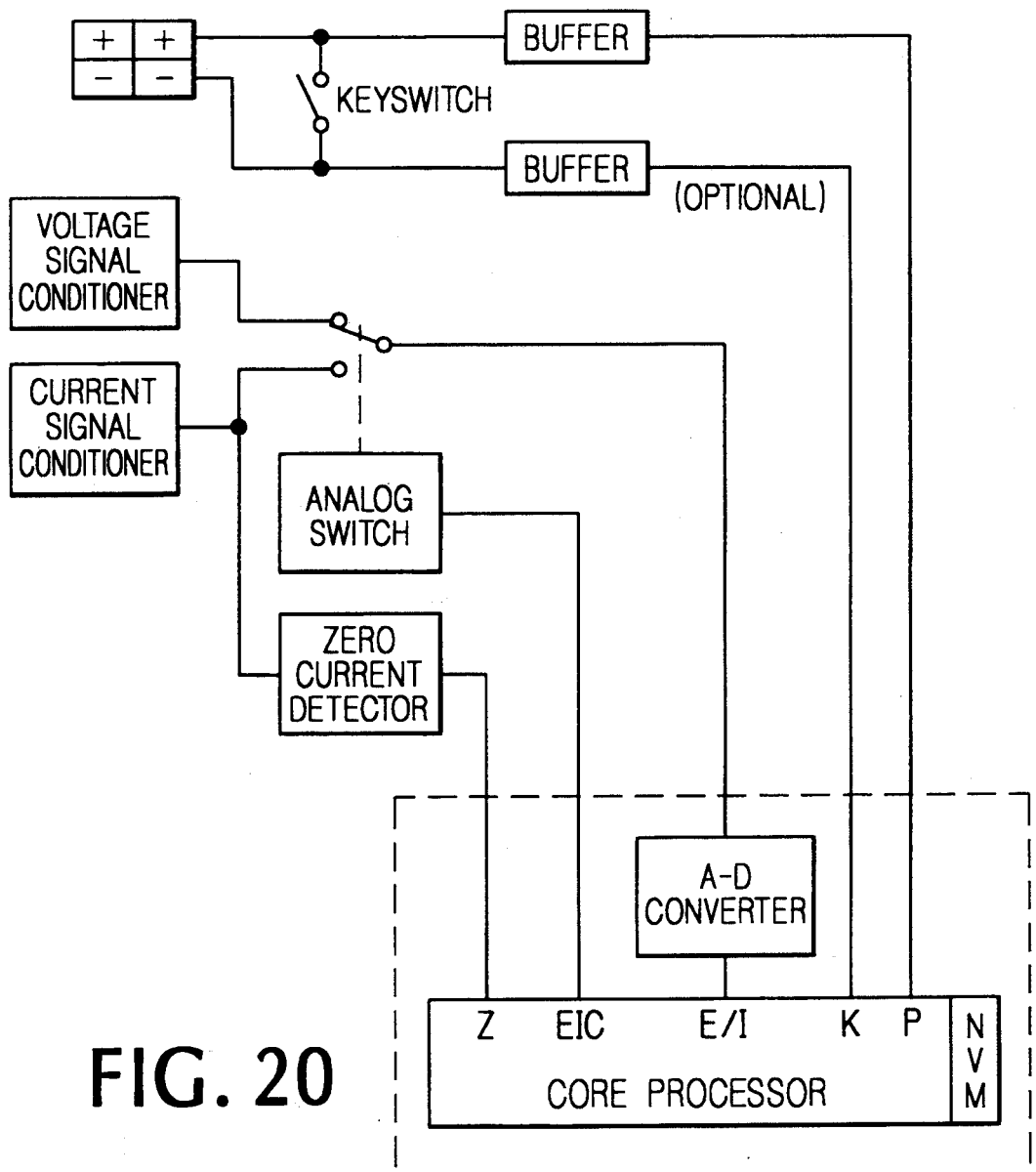
FIG. 20 is a single A/D converter modification of the system of FIG. 18.

It is possible to perform both conversions with a single A-D converter by time sharing conversions and holding the data through conversion pairings. This process assumes that the data in the first conversion is "nearly" simultaneous with the data in the second conversion. This assumption gets better and better as the integration/conversion interval gets smaller and smaller relative to the rates of change of the physical data. The core processor must, of course, receive a status bit identifying who is converting or, as shown in FIG. 20 do its own traffic control. The statistics might also be improved by periodically altering the holding sequence. For example, current hold through voltage conversion can be followed by voltage hold through current conversion, etc.

2.6. BUFFERS

The buffers are scaling and protection circuits which bring the unfiltered battery power down to safe limits for use by the core processor.

2.7. OUTPUT ENCODER FOR DISPLAY

The output encoder responds to the computed state-of-charge stored in time core processor and translates it into whatever format is required externally. The state-of-charge will typically be stored as a binary number, a binary coded decimal number or a hexadecimal number. The encoded output will typically be in a multiplexed seven segment format, a serial numeric code, a serial graphics code, or a serial address for a pointer display. The output encoder may be a separate function, but usually resides in the CPU as shown.

2.8. CORE PROCESSOR

The core processor completes the state-of-charge algorithm by operating on the voltage and current related inputs presented at the E, Z, and I ports (or the E/I and Z ports in the case of the single A-D converter) in conjunction with the power related inputs presented at the P and K ports. The functional description appears in Sections 3.0, 4.0, and 5.0 of this document.

2.9. NVM (NON-VOLATILE MEMORY)

The NVM holds the computed state-of-charge in memory whenever the power is disconnected. Typically this memory is an EEPROM integrated into the core processor as shown in FIGS. 18 and 20, The memory could also be an off-board EEPROM or a battery back-up using, for example, a lithium manganese dioxide coin cell.

3.0 RESET AND PRESET

The Standard 933 contains two means for resetting the state-of-charge calculation to full, namely; OCR (open circuit reset) and HVR (high voltage reset). OCR functions after power is removed and reapplied. It is looking for a battery replacement or disconnected recharge. HVR is used with on-board charging where the 933 remains connected to the battery.

This section will also describe OCP (open circuit preset), which under certain circumstances provides an alternative to OCR.

3.1. OCR (Open Circuit Reset)

When the power is removed and then a battery is reconnected the AA933 will test the open circuit voltage of that battery. If the voltage is above 2.09 VPC, or 50.16 volts for a 48 volt battery, the state-of-charge calculation is instructed to reset to full (100% S-0-C). If below, the S-0-C stored in memory will be recalled for use in the on-going calculations. The Standard 933 allows for an adjustment of OCR from 2.00 VPC to 2.18 VPC for certain extraordinary applications. The vast majority of 933's are operated at the factory setting of 2.09 VPC. Almost all fixed calibration models (900 series) are set at 2.09 VPC. This voltage should be accurate to ±0.5% @±25° C. and ±0.7% over the operating temperature range.

The OCR measurement is made once and only once upon power connect, usually within the time window of 1 to 5 seconds after first contact. If the delay is too short, contact bounce, slow connector engagement, and circuit non-stabilization will corrupt the measurement. If the time is too long the vehicle may be activated before the measurement is made.

3.2. HVR (High Voltage Reset)

The HVR measurement looks for a sustained high voltage condition in order to conclude that the battery has been substantially recharged. The Standard 933 (factory setting) will reset to full if the battery voltage exceeds 2.35 VPC, or 56.4 volts for a 48 volt battery, for an uninterrupted 6 minute interval. These criteria are as strongly dependent upon the charger as they are upon the battery. The extreme practical voltage limits are on the order of 2.30 VPC to 2.45 VPC. The upper time limits may extend to 2 or 3 hours to assure the last 20% of charge, but this is a severe operational restriction. Lower time limits are not recommended except in the case of pulse or reflex chargers, which have to be analyzed case-by-case. Voltage accuracy should be ±0.5% @25° C. and ±0.7% over the operating temperature range. Time accuracy is normally not critical, and an arbitrary control of ±25% is adequate.

3.3. OCP (Open Circuit Preset)

When a lead acid battery has been given sufficient stabilization time it will attain its theoretical open circuit voltage primarily as a function of its electrolyte concentration and to a small degree its temperature. The open circuit voltage, therefore, can become a static indicator of charge state if the range of electrolyte concentration is known.

Figure 21:
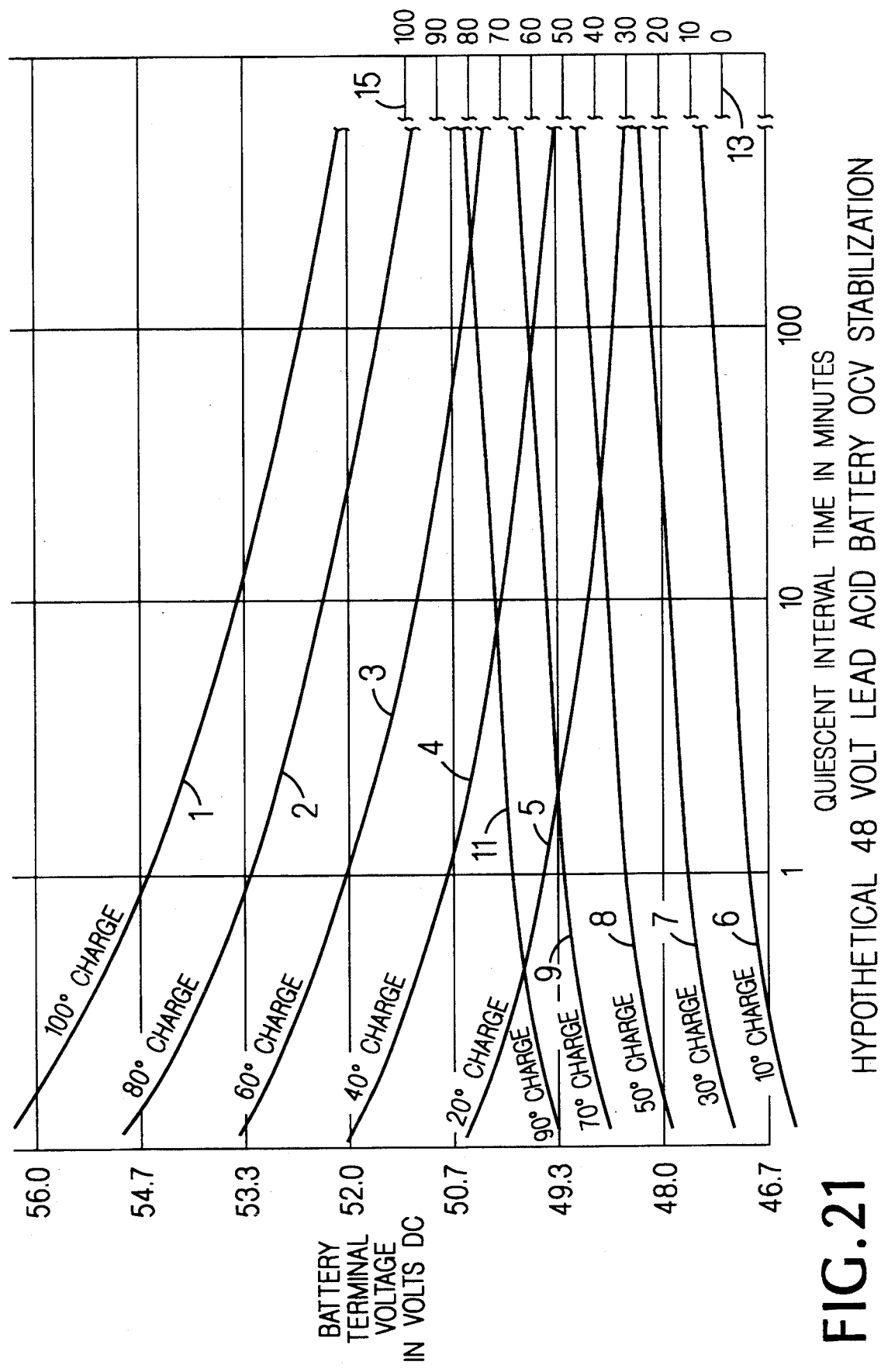
FIG. 21 graphically illustrates open circuit voltage stabilization for a hypothetical battery.

The advantage of an OCP initialization lies in its ability to interpolate intermediate charge states associated with the unknown battery. The major disadvantage lies in the need for a high degree of battery stabilization (hours to days). Until the battery stabilizes, the open circuit voltage will be high if last on charge and low if last on discharge. FIG. 21 shows a hypothetical case for a relatively fast recovery lead acid traction battery.

Figure 22:
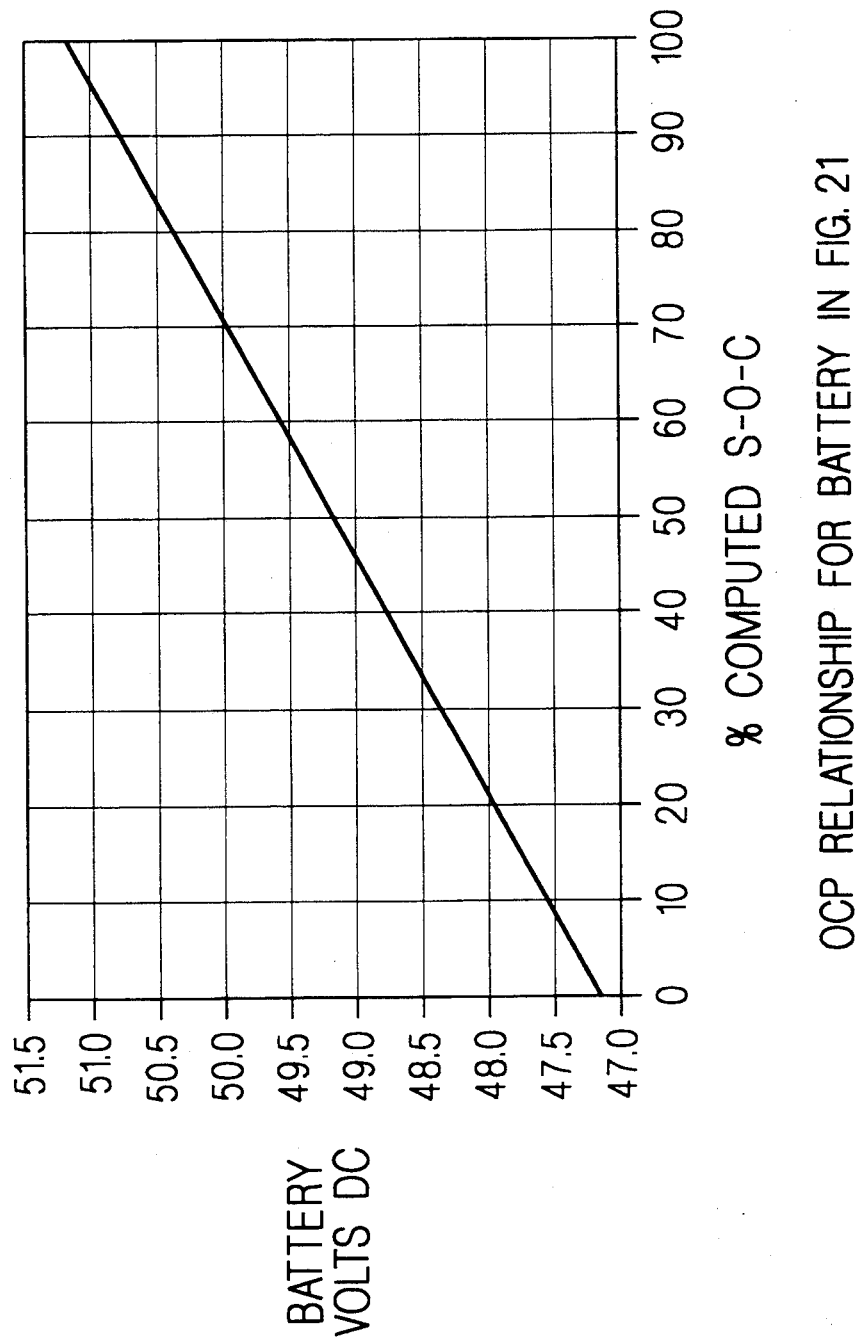
FIG. 22 graphically illustrates open circuit preset for the battery of FIG. 21.

To implement OCP a measurement of the battery voltage is made several seconds after connection (with the same considerations as OCR). This measurement is compared to the computed state-of-charge in accordance with the relationship shown in FIG. 22, The computed S-0-C is then incremented or decremented, as required, until the relationship reaches equilibrium. The loop is then locked out, and must not be reactivated until the next power down/power up cycle.

4.0 INTEGRATION UNDER LOAD

The method is described in detail above. This section describes the apparatus in terms of FIG. 18 with a 20 millisecond A-D integration/conversion cycle. The computed S-0-C involves a form of integration which includes rate and differential voltage, but requires only addition and subtraction operations in the core processor. After each 20 millisecond conversion interval the current converter will direct the use of one of six integration threshold transforms, the zero current detector will signal that only non-zero information was present throughout the interval (if current had flowed continuously), and the voltage converter will present the voltage for use within the algorithm being executed by the core processor.

The following description is scaled for a full scale decimal representation of computed state-of-charge of 720,000. This number is established as follows:

$$1\frac{I}{C} \times 50\frac{C}{s} \times 3600\frac{s}{h} \times 4h = 720,000.$$

Where I is a single decimal integer, C=conversion, s=second(s), h=hour(s). When the integration process is proceeding at its lowest rate it requires 4 hours full scale, and the integrator decrements one integer per 20 millisecond conversion cycle (or 50 conversions per second). The highest rate integration decrements the integrator by 12 for each conversion and the full scale time reduces to ⅓ hour in accordance with:

$$12\frac{I}{C} \times 50\frac{C}{s} \times 3600\frac{s}{h} \times \frac{1}{3}h = 720,000.$$

4.1 ZERO CURRENT FLAG

During each 20 millisecond conversion interval the Z port to the core processor monitors time activity from the zero current detector, and if any is found a flag is set. This flag instructs the processor to skip the interval, in essence it issues a zero (0) increment/decrement command. If the flag is not set the processor proceeds with the calculation.

4.2. CURRENT THRESHOLDS

In addition to instantaneous zero current detection there are five (5) short term integrated (via the 20 millisecond A-D conversion) current levels, or thresholds, recognized by the core processor. These are shown in FIG. 23 and are nominally 80, 170, 270, 380, and 500 amperes. The combined error of threshold detection, over the operating temperature range is held within ±11% to ±16% as shown in the table. The input voltage to the A-D converter comes from the current signal conditioner operating with a gain of 48.4 as previously described in Section 2.2.

4.3. INTEGRATION ZONES

Figures 24B, 25:
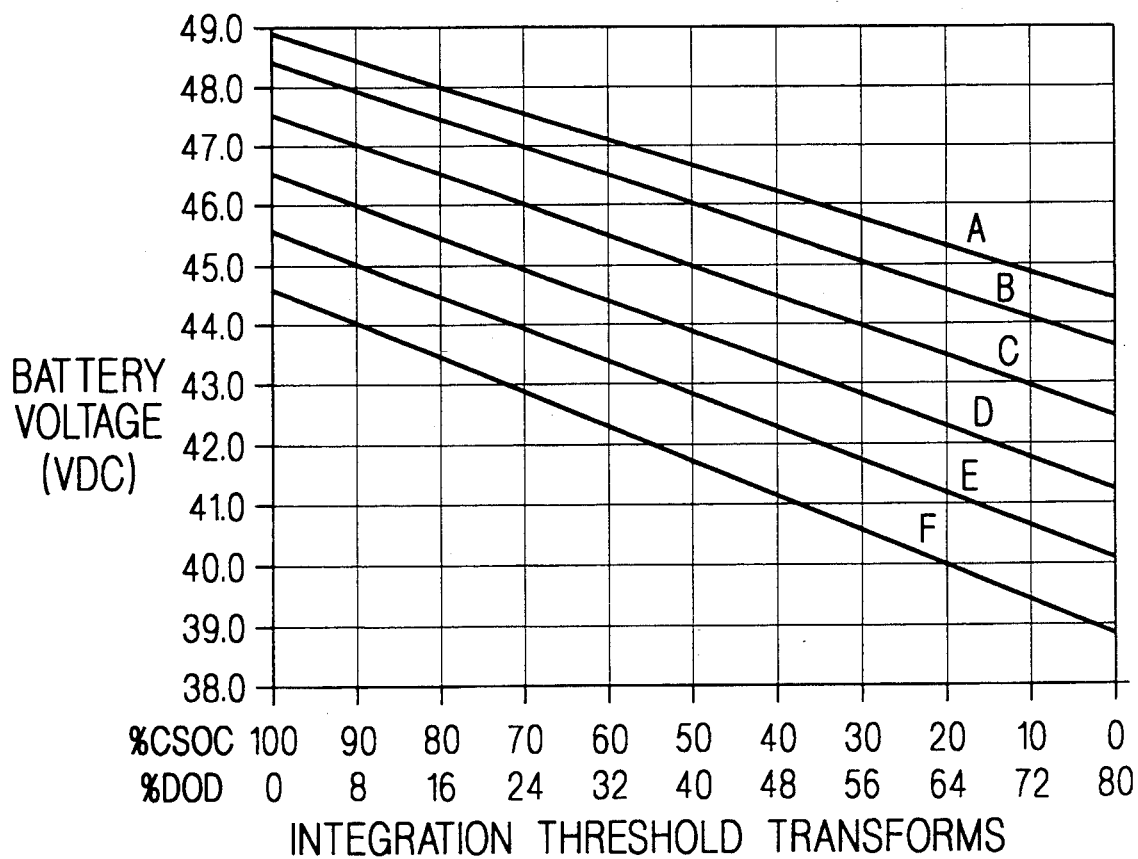
FIG. 25 graphically illustrates integration transforms for the six current zones of FIG. 24.

The five (5) current thresholds define six (6) integration zones. Each of these zones has an assigned integration threshold transform, a normal integration rate, and a fault detected integration rate, as shown in FIG. 24. The complete set of integration transforms converted to this 48 volt lead acid traction battery example is shown in FIG. 25 .Note that the transforms only cover the upper 80% of the battery's capacity in accordance with manufacturer's recommendations. The transforms could be extended to 100% depth-of-discharge, and then have the output encoder perform the desired range truncation, as described above. Truncation to depths-of-discharge less than 80% are best performed in the output encoder, thus preserving the full 80% range in the core processor.

Essentially one of four decisions must be made at the completion of each A-D conversion in accordance with the following schedule.

A) If the zero current flag is set do not decrement.
B) If the measured voltage is above the integration threshold for that current zone do not decrement.
C) If the measured voltage is below the integration threshold for that current zone, but above the integration threshold for file second higher current zone* decrement in accordance with the normal integer subtraction shown in FIG. 24.
D) If the measured voltage is below the integration threshold for the second higher current zone* decrement in accordance with the fault detected integer subtraction shown in FIG. 24.

*Except next higher current zone for zone E.

FIG. 26 summarizes the eighteen possibilities for a conversion interval occurring at 50% computed state-of-charge where the integrator is storing the decimal number 360,000, and the A through F integration thresholds are 46.68, 46.08, 45.00, 43.92, 42.84, and 41.76 volts DC respectively. The zero current detector is assumed to be set at 4 amperes.

4.4. SUMMARY

The core processor contains the AA933's main integrator. This integrator is initialized by incrementing to the decimal number 720,000 via either OCR or HVR after "Full" battery detection. Alternatively, it can be initialized to any intermediate value by incrementing or decrementing, as required, via OCP.

Subsequently, the integrator will be allowed to decrement only, under control of the algorithm described in Section 4.3. This algorithm examines the computed state-of-charge, the 20 millisecond integrated average battery voltage, the 20 millisecond integrated average battery current and the confirmation of continuous current flow after the completion of each 20 millisecond A-D conversion interval. This examination results in the identification of one-of-eighteen possibilities. Seven of these possibilities result in no subtraction. Two of the possibilities result in a subtraction of 1, one results in a subtraction of 2, one results in a subtraction of 4, two result in a subtraction of 6, three result in a subtraction of 8, and two result in a subtraction of 12.

This process continues throughout the battery's discharge every 20 milliseconds until the main integrator has decremented to zero. When zero is attained the battery has reached 80% depth-of-discharge.

5.0 QUIESCENT MONITORING

All batteries self discharge. The differences are merely a matter of rate. The self discharge mechanism is primarily a function of electrochemistry, construction, temperature, age, and instantaneous state-of-charge. Large lead acid traction batteries might completely self discharge in 4 months when young and cool or 2 weeks when old and hot.

The AA933 can be configured to approximate the self-discharging charge state by using the stabilized open circuit voltage approximation. It is preferred that the integrator be allowed to decrement only after a long quiescent interval, say 8 to 24 hours. It is also important that the monitoring circuitry constitutes a negligible load on the battery. This can be accomplished by having a low power system, or a higher power system with periodic wake-ups from a low power quiescence detection time clock.

The signal for quiescence may come via the keyswitch or the zero current detector, after consideration is given to such practical aspects as power consumption, current detection resolution, standby loads, etc.

For illustrative purposes an assumption will be made that the total system standby current is too great for continuous operation, and that a wake-up approach is required. It is also assumed that the open loop integration run-down to zero must take place within two weeks (336 hours calendar time).

Figure 27:
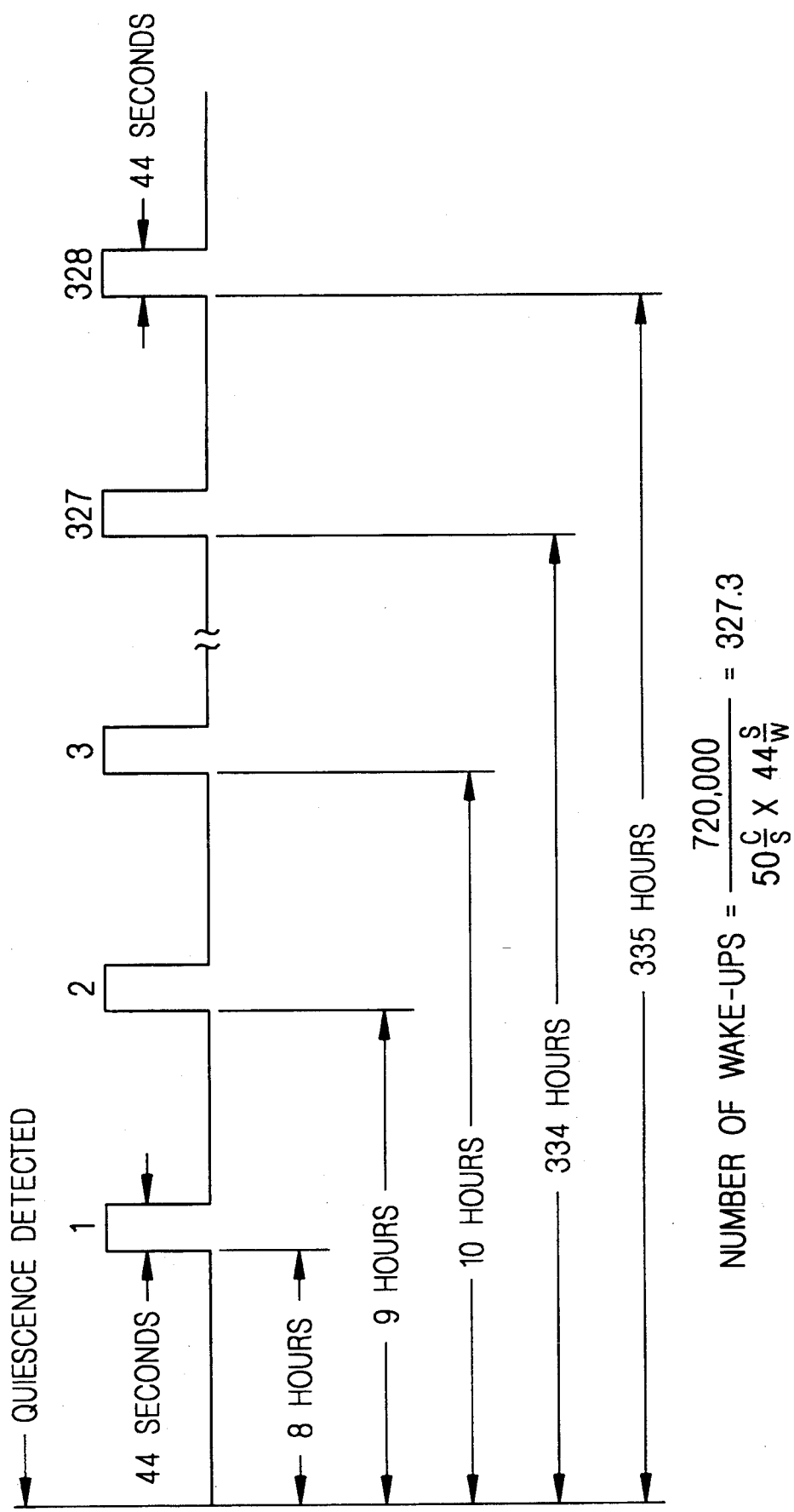
FIG. 27 illustrates a wake up program for quiescent monitoring of a battery.

FIG. 27 shows a wake-up program for quiescent monitoring that allows the integrator to decrement by 1 for each 20 millisecond conversion during a 44 second wake-up interval. The first wake-up occurs 8 hours after quiescence is first detected, and each subsequent wake-up is spaced at 1 hour intervals.

Figure 28:
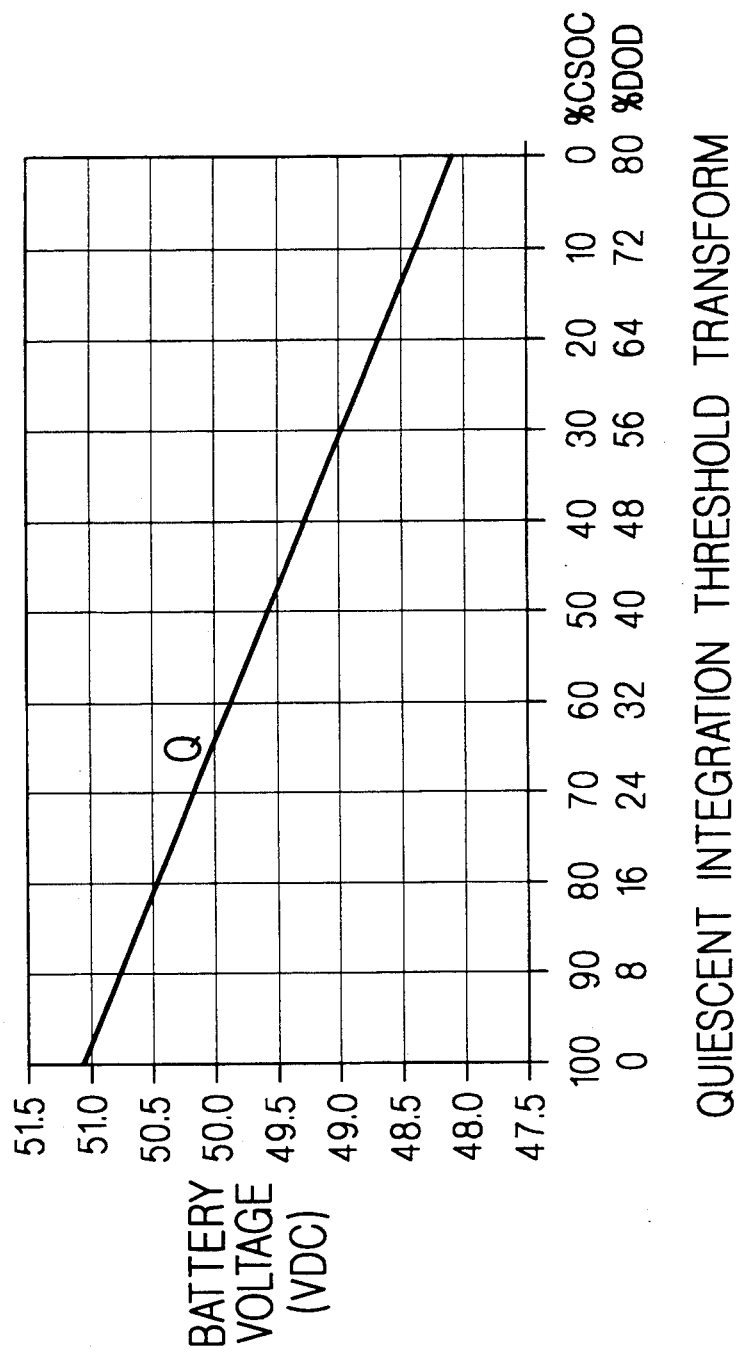
FIG. 28 graphically illustrates a quiescent integration threshold transform.

FIG. 28 shows a typical open circuit voltage transform which the integrator follows in its normal manner. This essentially introduces a seventh integration threshold transform, which is arbitrarily named Q. This Q transform assumes that the specific gravity of the battery varies from approximately 1.280 at full charge to approximately 1.150 at 80% depth-of-discharge.

It will thus be seen that the objects set forth above, among those elucidated in, or made apparent from, the preceding description, are efficiently attained and, since certain changes may be made in the above construction without departing from the scope of the invention, it is intended that all matter contained in the above description or shown on the accompanying drawing figures shall be interpreted as illustrative only and not in a limiting sense.

It is also to be understood that the following claims are intended to cover all of the generic and specific features of the invention herein described and all statements of the scope of the invention which, as a matter of language, might be said to fall therebetween.

I claim:

1. A metering system for measuring and indicating the state of charge of an electrical storage battery, comprising:
    (a) means for storing a numerical value indicative of the state of charge of said battery and for providing an output voltage signal representative thereof;
    (b) means for detecting the terminal voltage of said battery, coupled to said means for storing, and being operable to generate a function of said battery terminal voltage which is a substantially proportional fraction of said terminal voltage and to provide an input to said means for storing if said function is below a threshold variable reference voltage signal;

(c) means for receiving said output voltage signal and for generating said variable reference voltage signal therefrom, said variable reference voltage signal being lowered as a function of said output voltage signal when said output voltage signal indicates progressively lower states of charge; and (d) means for measuring the rate of current drawn from said battery and adjusting said means for receiving and generating, in proportion to said rate, such that said variable reference voltage signal will be greater or lesser depending on the instantaneous level of said rate.

2. A metering system, as defined in claim 1, wherein said means for measuring said rate of current is selected from the group consisting of: measurement of current across a shunt resistor, a Hall effect current sensor, a pressure transducer connected to sense pressure generated by equipment powered by said current drawn from said battery, measurement of temperature rise of a component due to said current or a portion of said current drawn from said battery, and detection of closure of a contactor connected to cause said current to be drawn from said battery.

3. A metering system, as defined in claim 1, wherein: said means for generating said variable reference voltage signal includes a series of switched resistors, said resistors being switched in predetermined patterns, each said pattern indicating a unique range of current levels.

4. A metering system, as defined in claim 3, further comprising:

(a) each said switched resistor coupled through a driver to one of a plurality of data flip flops, each said data flip flop being coupled to a sequencer;

(b) each said data flip flop coupled to one of a plurality of comparators, said comparators having reference voltage inputs of different levels and having data inputs;

(c) means to derive said data inputs from measurement of said current; and (d) said sequencer to periodically strobe said data flip flops to cause said resistors to be switched in one of said predetermined patterns.

5. A metering system, as defined in claim 4, wherein: said means to derive said data inputs includes an analog current integrator connected to receive inputs from current measuring means.

6. A metering system, as defined in claim 4, wherein: said means to derive said data inputs includes a digital voltage integrator connected to receive inputs from current measuring means.

7. A metering system, as defined in claim 6, wherein said digital voltage integrator comprises: a voltage-to-frequency converter connected to receive inputs from current measuring means and a binary counter connected to receive inputs from said voltage-to-frequency converter and to provide inputs to a logic circuit coupled through drivers to said switched resistors to cause said resistors to be switched in one of said predetermined patterns.

8. A metering system, as defined in claim 1, wherein said means for storing includes a digital integrator having an integration rate set by a rate resistance, said rate resistance comprising: a series of switched resistors, said resistors being switched in predetermined patterns, each said pattern indicating a unique range of current levels.

9. A method of measuring and indicating the state of charge of an electrical storage battery, comprising:

(a) storing a numerical value indicative of the state of charge of said battery and providing an output voltage signal representative thereof;

(b) detecting the terminal voltage of said battery, generating a function of said battery terminal voltage which is a substantially proportional fraction of said terminal voltage, and changing said numerical value if said function is below a threshold variable reference voltage signal;

(c) receiving said output voltage signal and generating said variable reference voltage signal therefrom, said variable reference voltage signal being lowered as a function of said output voltage signal when said numerical value indicates progressively lower states of charge; and (d) measuring the rate of current drawn from said battery and adjusting said variable reference voltage signal, in proportion to said rate, such that said variable reference voltage signal will be greater or lesser depending on the instantaneous level of said rate.

10. A method, as defined in claim 9, wherein said step of measuring said rate of current is selected from the group consisting of: measuring current across a shunt resistor, measuring the output of a Hall effect current sensor, measuring the output of a pressure transducer connected to sense pressure generated by equipment powered by said current drawn from said battery, measuring temperature rise of a component due to said current or a portion of said current drawn from said battery, and detecting closure of a contactor connected to cause said current to be drawn from said battery.

11. A method, as defined in claim 9, wherein generating said variable reference voltage signal comprises: switching a series of switched resistors in predetermined patterns, each said pattern indicating a unique range of current levels.

12. A method, as defined in claim 11, further comprising:

(a) providing each said switched resistor coupled through a driver to one of a plurality of data flip flops;

(b) providing each said data flip flop coupled to one of a plurality of comparators, said comparators having reference voltage inputs of different levels and having data inputs;

(c) deriving said data inputs from measurement of said current; and (d) periodically strobing said data flip flops to cause said resistors to be selectively switched in one of said predetermined patterns.

13. A method, as defined in claim 12, wherein: deriving said data inputs includes providing an analog current integrator connected to receive inputs from current measuring means.

14. A method, as defined in claim 12, wherein: deriving said data inputs includes providing a digital voltage integrator connected to receive inputs from current measuring means.

15. A method, as defined in claim 14, further comprising: providing said digital voltage integrator as a voltage-to-frequency converter connected to receive inputs from current measuring means and a binary counter connected to receive inputs from said voltage-to-frequency converter and to provide inputs to a logic circuit coupled through drivers to said switched resistors to cause said resistors to be switched in one of said predetermined patterns.

16. A method, as defined in claim 9, further including: storing said value in a digital integrator having an integration rate set by a rate resistance, said rate being set by selectively switching a series of switched resistors in predetermined patterns, each said pattern indicating a unique range of current levels.

* * * * *